(12) United States Patent
Oliver et al.

(10) Patent No.: US 9,124,235 B2
(45) Date of Patent: Sep. 1, 2015

(54) MEDIA CONTENT MANAGEMENT AND PRESENTATION SYSTEMS AND METHODS

(75) Inventors: Michael R. Oliver, Hoboken, NJ (US); Brian F. Roberts, Dallas, TX (US)

(73) Assignee: VERIZON PATENT AND LICENSING INC., Basking Ridge, NJ (US)

( * ) Notice: Subject to any disclaimer, the term of this patent is extended or adjusted under 35 U.S.C. 154(b) by 73 days.

(21) Appl. No.: 13/251,183

(22) Filed: Sep. 30, 2011

(65) Prior Publication Data

US 2013/0086474 A1    Apr. 4, 2013

(51) Int. Cl.
| | |
|---|---|
| G06F 17/30 | (2006.01) |
| H03H 7/01 | (2006.01) |
| G11B 27/031 | (2006.01) |
| G11B 27/10 | (2006.01) |
| H03H 3/007 | (2006.01) |
| G06F 17/24 | (2006.01) |

(52) U.S. Cl.
CPC ....... *H03H 7/0115* (2013.01); *G06F 17/30053* (2013.01); *G11B 27/031* (2013.01); *G11B 27/105* (2013.01); *H03H 3/007* (2013.01); *H03H 7/0138* (2013.01)

(58) Field of Classification Search
CPC .............. G06F 17/30772; G06F 17/30749; G06F 17/30056; G06F 17/30017; G06F 17/30053; H03H 7/0115; H03H 3/007; H03H 7/0138; G11B 27/105; G11B 27/031
USPC ......... 715/715, 727, 764, 809, 813, 821, 841, 715/845
See application file for complete search history.

(56) References Cited

U.S. PATENT DOCUMENTS

| | | | | |
|---|---|---|---|---|
| 6,031,797 | A  * | 2/2000 | Van Ryzin et al. | 369/30.28 |
| 7,043,477 | B2 * | 5/2006 | Mercer et al. | 1/1 |
| 7,434,165 | B2 * | 10/2008 | Kleinman et al. | 715/732 |
| 7,685,210 | B2 * | 3/2010 | Plastina et al. | 707/805 |
| 2006/0253782 | A1 * | 11/2006 | Stark et al. | 715/727 |
| 2007/0053268 | A1 * | 3/2007 | Crandall et al. | 369/53.31 |
| 2008/0301173 | A1 * | 12/2008 | Ryu et al. | 707/102 |
| 2009/0070339 | A1 * | 3/2009 | Cho et al. | 707/10 |
| 2009/0222115 | A1 * | 9/2009 | Malcolm et al. | 700/94 |

* cited by examiner

*Primary Examiner* — Stephen Hong
*Assistant Examiner* — Wilson Tsui

(57) ABSTRACT

Exemplary media content management and presentation systems and methods are described herein. An exemplary method includes a media content presentation system linking together multiple media content instances, playing back or managing a playlist that includes the linked media content instances, and processing the linked media content instances as a block of linked media content instances within the playing back or managing of the playlist. Another exemplary method includes a media content presentation system playing back a media content instance for experiencing by a user, presenting a playback user interface in conjunction with the playing back of the media content instance, and providing, within the playback user interface, one or more media management tools configured for use by the user to manage the media content instance during the playing back of the media content instance. Corresponding systems and methods are also disclosed.

20 Claims, 18 Drawing Sheets

| | 300 ↘ |
|---|---|
| Song (304) | Linked Songs (306) |
| 302 — Song 206-2 | Song 206-8 |

Fig. 3A

| | 310 ↘ |
|---|---|
| Song (314) | Linked Songs (316) |
| 312-1 — Song 206-2 | Song 206-8 |
| 312-2 — Song 206-8 | Song 206-2 |

Fig. 3B

MEDIA CONTENT MANAGEMENT AND PRESENTATION SYSTEMS AND METHODS

BACKGROUND INFORMATION

As digital media technologies have advanced, personal digital media collections have grown in size and popularity. A typical personal digital media collection, which may include numerous photos, songs, e-books, audio books, movies, videos, and/or other forms of media content, may be stored locally on a user's device (e.g., a personal computer or portable media player device) or hosted at a remote data center.

Typically, a user utilizes a software application known as a media player to manage and play back media content included in the user's personal digital media collection (e.g., to manage and play back songs in the user's personal digital music library). Using a media player, the user is able add, delete, and/or organize media content in the user's personal digital media collection. For example, a conventional media player provides functionality that allows the user to create a playlist by selecting desired media content from the user's personal digital media collection for inclusion in the playlist. The media player is able to play back the playlist for experiencing by the user. Certain media players provide functionality for randomizing the playback of the playlist such that media content instances included in the playlist are randomly selected for playback. Such randomized playback is commonly referred to as "random" or "shuffle" playback.

There remains room to improve conventional media players and other tools for managing and playing back media content included in a personal digital media content library. For example, new and/or improved services, features, functions, and/or user interfaces related to managing personal digital media content libraries, managing media content playlists, and/or controlling playback of media content are desired. To illustrate just one example, conventional media players do not provide a user with functionality to control how media content included in a playlist is selected for playback during "random" or "shuffle" playback of the playlist. To illustrate another example, conventional media players do not provide a user with robust and/or useful media content management functionality that can be accessed and used "on the fly" in the context of media content playback.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical or similar reference numbers designate identical or similar elements.

FIGS. 3A-3B illustrate exemplary linking data tables according to principles described herein.

DETAILED DESCRIPTION OF PREFERRED EMBODIMENTS

Figure 1:
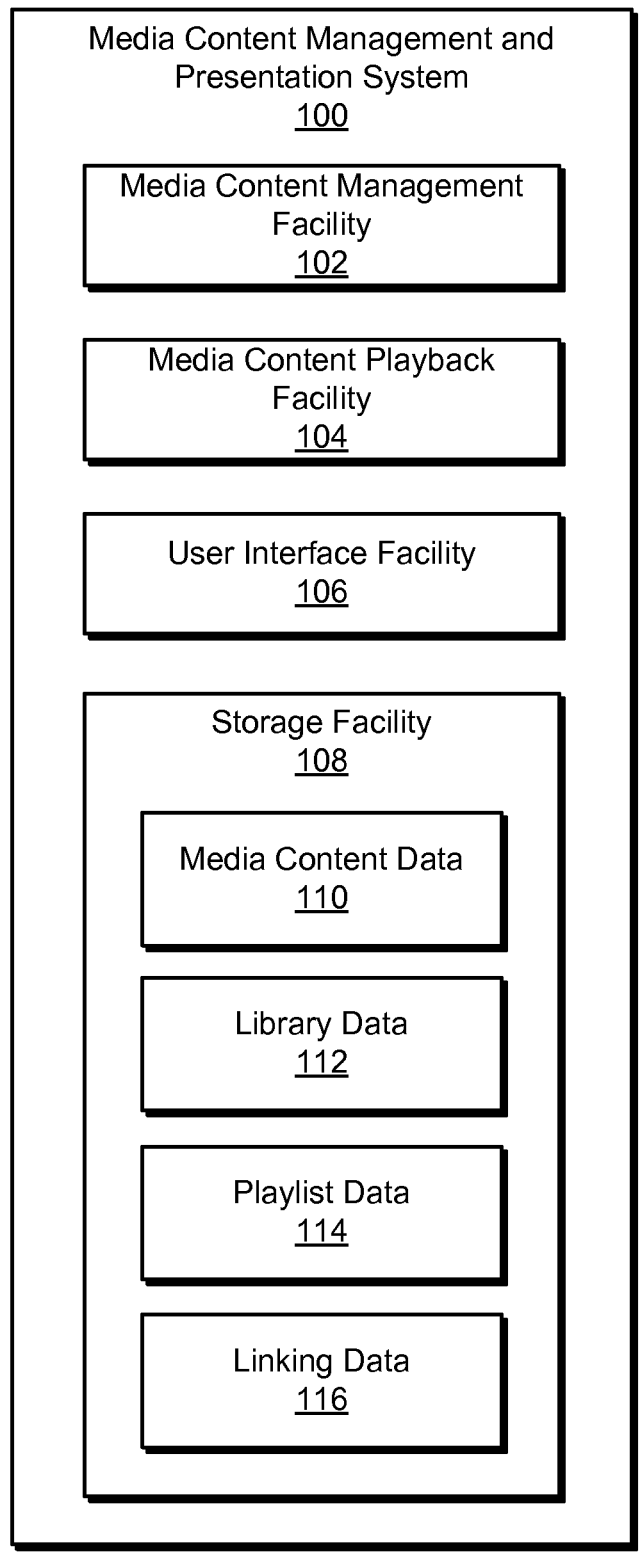
FIG. 1 illustrates an exemplary media content management and presentation system according to principles described herein.

Exemplary media content management and presentation systems and methods are described herein. In certain examples, the media content management and presentation systems and methods may provide new and/or improved services, features, functions, and/or user interfaces related to managing digital media content libraries, managing media content playlists, and/or controlling playback of media content.

As an example, exemplary media content management and presentation systems and methods may provide services, features, functions, and/or user interfaces related to linking together multiple discrete media content instances (e.g., digitally represented songs) included in a media content library and/or playlist and processing the linked media content instances as an indivisible block of linked media content instances in one or more media content management and/or playback operations. To illustrate, an exemplary method includes a media content presentation system linking together multiple media content instances, playing back or managing a playlist that includes the linked media content instances, and processing the linked media content instances as a block of linked media content instances within the playing back or managing of the playlist. Another exemplary method may include a media content presentation system linking together multiple media content instances, randomizing a playback of a playlist that includes the linked media content instances, and processing the linked media content instances as an indivisible block of linked media content instances within the randomizing of the playback of the playlist.

As another example, exemplary media content management and presentation systems and methods may provide services, features, functions, and/or user interfaces related to managing media content within a digital media content library and/or playlist "on the fly" within a context of a playback of media content (e.g., during playback of media content and/or by way of a playback user interface presented during playback of media content). To illustrate, an exemplary method may include a media content presentation system playing back a media content instance for experiencing by a user, presenting a playback user interface during the playing back of the media content instance, and providing, within the playback user interface, one or more media management tools (e.g., playlist management tools) configured for use by the user to manage the media content instance during the playing back of the media content instance.

These and/or other services, features, functions, user interfaces and/or benefits provided by the disclosed exemplary media content management and presentation systems and methods will be made apparent herein.

As used herein, "media content" refers to any digitally represented content capable of being included in a digital media content library and played back by a computing device (e.g., a media player device) for experiencing by a user. "Media content instance" refers to any digitally represented discrete instance of media content such as an audio program (e.g., a song, an audio book, a radio program, an audio recording, etc.), a video program (e.g., a television program, a movie, etc.), a multimedia program, a digital image (e.g., a still-shot image, a photograph, etc.), and any other discrete instance of media content that is capable of being included in a digital media content library and played back by a computing device.

Examples of media content management and presentation systems and methods will now be described in reference to the accompanying drawings.

FIG. 1 illustrates an exemplary media content management and presentation system 100 (or simply "management system 100," "presentation system 100," or "system 100"). As shown, system 100 may include, without limitation, a media content management facility 102 (or simply "management facility 102), a media content playback facility 104 (or simply "playback facility 104"), a user interface facility 106, and a storage facility 108, which may be in communication with one another using any suitable communication technologies. It will be recognized that although facilities 102-108 are shown to be separate facilities in FIG. 1, any of facilities 102-108 may be combined into fewer facilities, such as into a single facility, or divided into more facilities as may serve a particular implementation.

Data generated and/or used by system 100 may be stored in storage facility 108. For example, storage facility 108 may store media content data 110 representative of and/or otherwise related to media content, library data 112 representative of a library of media content, playlist data 114 representative of one or more playlists of media content, and linking data 116 representative of links between linked media content instances included in a digital media content library and/or playlist. Examples of media content, digital media content libraries, media content playlists, and linked media content instances are described herein. Additional and/or alternative data may be stored by storage facility 108 in other embodiments.

Management facility 102 may be configured to perform one or more operations related to management of media content included in a digital media content library and/or playlist. For example, management facility 102 may create a digital media content library and/or playlist, add media content to a digital media content library and/or playlist, delete media content from a digital media content library and/or playlist, organize media content within a digital media content library and/or playlist, and/or otherwise manage media content included in a digital media content library and/or playlist. To this end, management facility 102 may generate and maintain library data 112 representative of a media content library and playlist data 114 representative of one or more playlists.

Figure 2:
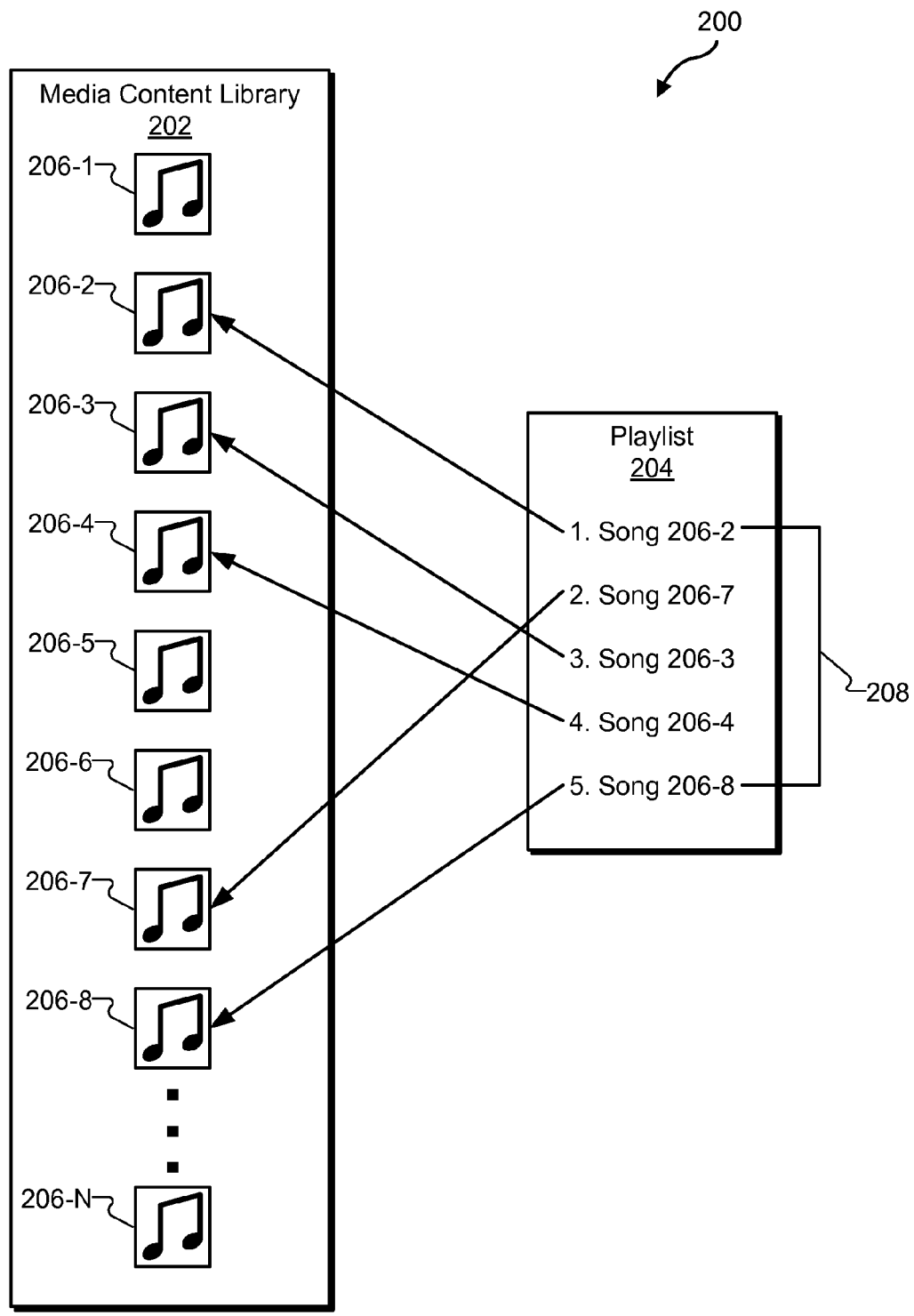
FIG. 2 illustrates an exemplary linking of media content instances in relation to a media content library and playlist according to principles described herein.

FIG. 2 illustrates an exemplary representation 200 of a media content library 202 and playlist 204. Management facility 102 may maintain data representative of media content library 202, which in some examples may include a plurality of media content instances in the form of digitally represented songs 206 (e.g., songs 206-1 through 206-N). Media content library 202 may comprise a physical representation of songs 206 (e.g., song data physically stored in a non-transitory computer-readable medium) and/or a logical representation of songs 206 (e.g., data pointing to and/or otherwise associated with song data physically stored in a non-transitory computer-readable medium). In certain examples, media content library 202 may be a personal music library of a user.

Songs 206 may be organized in any suitable way within media content library 202. For example, songs 206 may be sorted, filtered, and/or organized by one or more song attributes such as album, artist, title, genre, etc., which attributes may be specified in song metadata included in media content data 110.

Management facility 102 may maintain data representative of playlist 204, which may include one or more songs 206 selected from media content library 202. For example, a user may provide input to create and define playlist 204 to include a specific arrangement of songs (i.e., specific songs arranged in a specific user-defined order) selected from media content library 202. In the example shown in FIG. 2, playlist 204 includes songs 206-2, 206-7, 206-3, 206-4, and 206-8 in that particular order, which order may govern the order in which the songs 206-2, 206-7, 206-3, 206-4, and 206-8 will be played back during a sequential playback of playlist 204 by playback facility 104.

Management facility 102 may be further configured to link together discrete media content instances included in a media content library and/or playlist and to maintain linking data 116 representative of the link(s) between the linked media content instances. To illustrate, FIG. 2 shows an exemplary link 208 linking songs 206-2 and 206-8 within playlist 204.

Management facility 102 may be configured to link together media content instances in any suitable way. For example, management facility 102 may generate linking data 116 representative of a link (e.g., link 208) between media content instances. The linking data 116 may be in any suitable format and may be stored at any location and/or associated with any other data that allows the linking data 116 to be accessed and used to identify the link between the media content instances. In certain embodiments, linking data 116 representative of the link may be appended to one or more data records that contain information about the media content instances (e.g., as one or more pointers appended to data records representative of the media content instances). In certain embodiments, a link data record representative of the link may be created and the linked media content instances wrapped within the link data record, which wrapping and/or link data record indicates a link between the media content instances. In certain embodiments, a linking data table may be created and may represent the link.

FIG. 3A shows an exemplary linking data table 300 that represents link 208 shown in FIG. 2. As shown, table 300 includes a single-row entry 302 representative of link 208 between song 206-2 and song 206-8. Column 304 of table 300 may be used as an index that may be searched to identify whether a particular song is included in table 300. If the song is located in table 300, information included in column 306 may be accessed and used to identify one or more other songs that are linked to the song. For example, song 206-2 may be located in column 304, and song 206-8 may be identified, from data included in column 306, as a song that is linked to song 206-2.

In certain embodiments, management facility 102 may be configured to form a one-way link or a two-way link between media content instances. To illustrate, table 300 represents a one-way link in a single direction from song 206-2 to song 206-8 for an embodiment in which link 208 is a one-way link. For an embodiment in which link 208 is a two-way link, management facility 102 may generate a different table representative of the two-way link. To illustrate, FIG. 3B shows a linking data table 310 that represents a two-way link between songs 206-2 and 206-8. In table 310, row 312-1 represents a directional link from song 206-2 to song 206-8, and row 312-2 represents a reverse directional link from song 206-8 to song 206-2. Thus, table 310 represents a two-way link between songs 206-2 and 206-8. Column 314 of table 310 may be used as an index that may be searched to identify whether or not a particular song is included in table 310 and to access linking information in column 316 for any song located in column 312.

Management facility 102 may be configured to generate and maintain data representative of links having various scopes. In certain embodiments, for example, the scope of a link may be limited to a specific playlist. Returning to FIG. 2, for instance, the scope of link 208 may be specific and limited to playlist 204. Accordingly, system 100 may use link 208 to control and/or influence one or more operations of system 100 only when the operations are within the context of playlist 204. For example, when processing playlist 204, such as when playing back playlist 204, system 100 may take link 208 into account to control or otherwise influence the processing, such as in any of the ways described herein. When a link is specific to playlist 204, linking data 116 representative of the link may be included in or otherwise associated with playlist data 114 for playlist 204.

Figure 4:
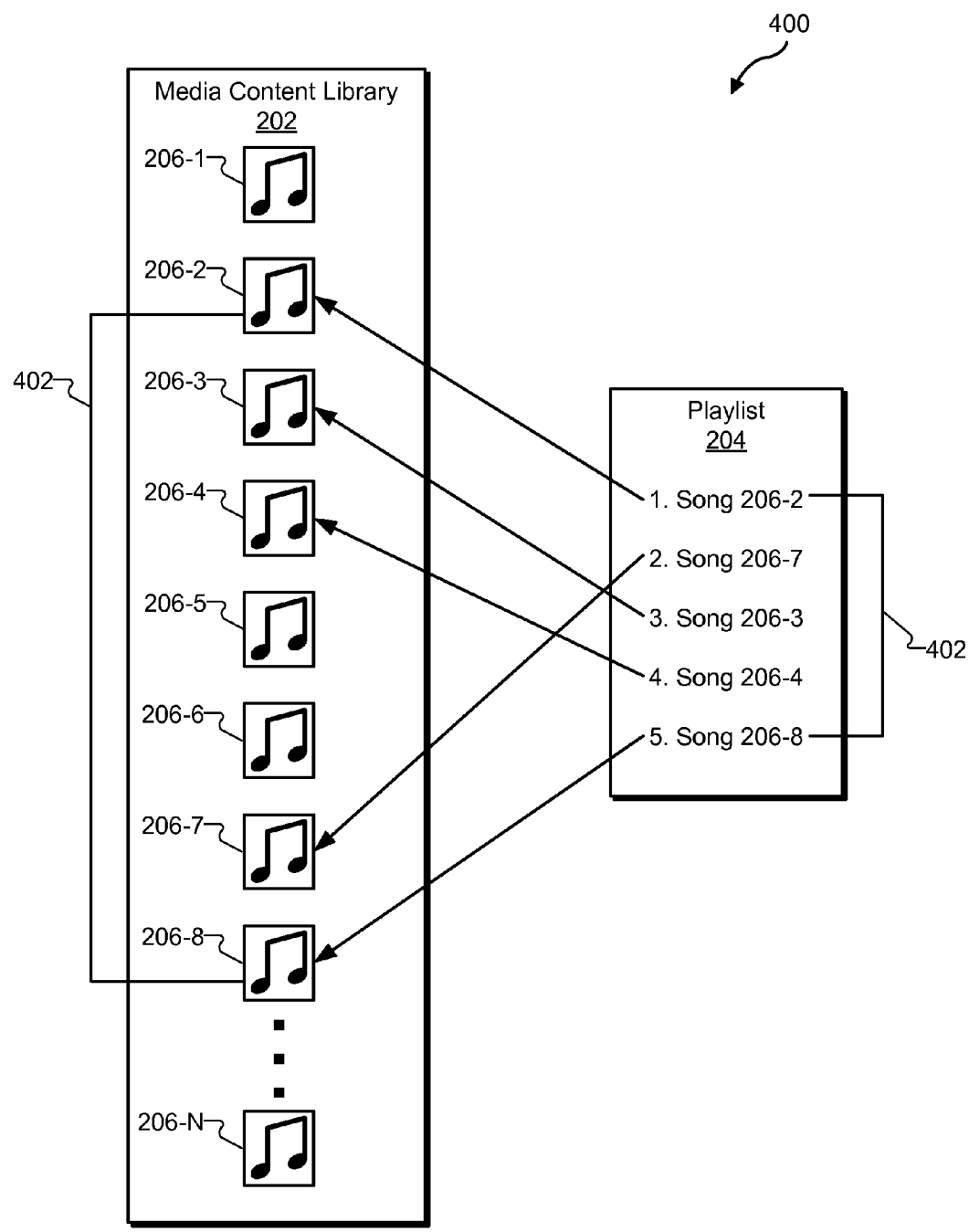
FIG. 4 illustrates another exemplary linking of media content instances in relation to a media content library and playlist according to principles described herein.

As another example, the scope of a link may be global across system 100. To illustrate, FIG. 4 shows a representation 400 of media content library 202 and playlist 204 in which a link 402 links together songs 206-2 and 206-8 at the media content library level. When songs 206 are linked together at this level, the link between the songs may be global in scope. Accordingly, link 402 may be carried into and applied within any playlists of songs 206 selected from media content library 202. For instance, FIG. 4 shows that link 402 applies to playlist 204. Link 402 may be similarly applied to any other playlist associated with media content library 202. Accordingly, system 100 may use link 402 to control and/or influence one or more operations of system 100 when the operations are within the context of library 202 or any playlist associated with library 202. For example, when processing a management or playback operation in the context of library 202 or any associated playlist, system 100 may take link 402 into account to control or otherwise influence the processing, such as in any of the ways described herein. When a link is global in scope across media content library 202 and any associated playlists, linking data 116 representative of the link may be included in or otherwise associated with library data 112. Linking data 116 representative of the link may also be included in playlist data 114 representative of any playlist associated with library 202.

As described in more detail herein, a link between multiple media content instances may represent a desired grouping of media content instances that is to be processed as a media content block for one or more operations of system 100. For example, a user may want two particular songs within the user's personal digital music library to always be played back-to-back as a block of two songs. The user may provide input that directs system 100 to link together those two songs within the library. Thereafter, system 100 may process the linked songs as a block for certain operations of system 100. The block may be indivisible for certain operations of system 100.

As another example, a user may want two songs within the user's personal digital music library to always be played back-to-back as a block of two songs within a particular playlist. The user may provide input that directs system 100 to link together those two songs within the playlist. Thereafter, system 100 may process the linked songs as a block for certain operations of system 100 associated with the playlist. The block may be indivisible for certain operations of system 100 associated with the playlist.

A link may represent a block relationship between any media content instances included in a media content library and/or playlist. Linked media content instances may be otherwise discrete and related or unrelated by shared metadata attributes. By providing a user with functionality for linking together media content instances for block processing, system 100 may provide the user with increased control over media content management and playback operations compared to conventional media players.

Management facility 102 may link together discrete media content instances in response to any predetermined event. For example, management facility 102 may link together discrete media content instances in response to receipt of a user input command to link together the media content instances. To illustrate, a user may manually provide user input that is configured to initiate a linking together of certain media content instances identified by the user. Exemplary user input that may be provided to initiate a linking operation is described further below.

As another example, management facility 102 may automatically link together discrete media content instances in response to a detected satisfaction of a predefined linking trigger condition. In certain embodiments, the predefined linking trigger condition may include a performance of a particular operation by management facility 102. To illustrate, management facility 102 may be configured to perform one or more optimization operations to optimize media content instances in association with an addition of the media content instances to a media content library. An example of such operations includes management facility 102 detecting certain attributes of media content instances being ingested into the library and, based on the attributes, optimizing the media content instances for gapless playback such that when the media content instances are played back, a transition from playback of one of the media content instance to playback of another of the media content instances is gapless (i.e., does not contain a noticeable playback transition, silence, or a blank pause during the transition). Accordingly, management facility 102 may be configured to automatically link together media content instances that are optimized for gapless playback. In certain embodiments, such automatic linking may be enabled or disabled by a user selecting whether to enable or disable automatic linking in settings for management facility 102.

Management facility 102 may be further configured to delink linked media content instances. The delinking may be performed in any suitable way, such as by deleting linking data 116 representative of a link between media content instances. For example, management facility 102 may delete linking table 300 shown in FIG. 3A to delete link 208 and delink songs 206-2 and 206-8 in playlist 204.

Management facility 102 may delink linked media content instances in response to any predetermined event. For example, management facility 102 may delink linked media content instances in response to receipt of a user input command to delink the media content instances. To illustrate, a user may manually provide user input that is configured to initiate a delinking of linked media content instances identified by the user.

After linked media content instances are delinked, the media content instances will no longer be processed as a block of media content instances. For example, system 100 may process the delinked media content instances individually for operations of system 100, such as in any of the ways described herein.

Playback facility 104 may be configured to play back media content for experiencing by a user. For example, playback facility 104 may play back an individual media content instance. The playback may be on an individual basis or part of a playback of a digital media content library or playlist. During playback of media content included in a digital media content library, playback facility 104 selects and plays back media content instances included in the library. During playback of a playlist, playback facility 104 selects and plays back media content instances included in the playlist.

In certain examples, playback of a media content library or playlist may be sequential in that the selection and playback of media content instances included in the media content library or playlist is governed by and temporally follows the same order of the media content instances defined by the media content library or playlist (e.g., sequentially from the first media content instance to the last media content instance in the library or playlist). In certain other examples, playback of a media content library or playlist may be randomized by playback facility 104 in that the media content instances and/or an order of the media content instances selected for playback is randomly selected by playback facility 104. Because the playback is randomized, the selection and playback of media content instances (e.g., the order in which the media content instances are selected and played back) is not dictated or influenced by the order of the media content instances defined by the library or playlist.

User interface facility 106 may be configured to provide one or more user interfaces configured to facilitate user interaction with one or more services, features, and/or functions of system 100. Through a user interface, a user may provide input to manage media content and/or control playback of media content. In certain embodiments, user interface facility 106 may present certain user interfaces in conjunction with playback of media content by playback facility 104. Such user interfaces may be referred to as "playback user interfaces." Additionally or alternatively, user interface facility 106 may present certain user interfaces to facilitate user management of media content. Such user interface may be referred to as "management user interfaces." Exemplary graphical user interfaces ("GUIs") that may be presented by user interface facility 106 are described further below.

Certain operations performed by system 100 may process unlinked media content instances individually and linked media content instances as a block of linked media content instances. For example, certain playback operations may be performed by playback facility 104 in a way that processes linked media content instances as an indivisible block of linked media content instances. To illustrate, during playback of playlist 204 shown in FIG. 2, playback facility 104 may select to play back song 206-2. Playback facility 104 may detect the existence of a link (e.g., link 208) linking song 206-2 to song 206-8 within playlist 204. In response to this detection and based on the link, playback facility 104 may process songs 206-2 and 206-8 as an indivisible block of linked media content instances within the playback of playlist 204. In certain examples, this may be accomplished by playback facility 104 automatically playing back song 206-8 immediately following playback of song 206-2 within the playback of playlist 204. Accordingly, songs 206-2 and 206-8 will be played back as a block of songs within the playback of playlist 204.

The linked songs 206-2 and 206-8 may be treated as an indivisible block for sequential or randomized playback of playlist 204. In the case of randomized playback of playlist 204, linked songs 206-2 and 206-8 may be processed as an indivisible block of linked media content instances within the randomizing of the playback of playlist 204. In certain examples, each time song 206-2 is randomly selected for playback, song 206-8 will be automatically selected for playback immediately following the playback of song 206-2. In other examples, songs 206-2 and 206-8 will be grouped and processed as a block within the random selection of songs within playlist 204 to be played back. In this case, playback facility 104 may randomly select from a group consisting of song 206-7, song 206-3, song 206-4, and the block of linked songs that includes songs 206-2 and 206-8 to determine which individual song or block of linked songs will be played back next in the random playback.

In the case of sequential playback of playlist 204, playback facility 104 may process linked songs 206-2 and 206-8 as an indivisible block of linked media content instances within the sequential playback of playlist 204. For example, playback facility 104 may select song 206-2 for playback based on the ordered position of song 206-2 within playlist 204. Playback facility 104 may detect a link between song 206-2 and 206-8 and, in response to this detection and based on the link, may select song 206-8 for playback immediately following the playback of song 206-2 in the sequential playback of playlist 204. After playback of song 206-8, playback facility 104 may select song 206-7, based on the list order defined by playlist 204, as the next sequential song for playback and may continue down the list of songs included in playlist 204 for the sequential playback. After playback of song 206-4 based on its sequential order in playlist 204, playlist facility 104 may be configured to either play back song 206-8 as the next sequential song in playlist 204 or to ignore and not play back song 206-8 based on its ordered position following song 206-4 in playlist 204 because song 206-8 was already played back immediately following the playback of song 206-2 based on the link between songs 206-2 and 206-8. Playlist facility 104 may be configured to make this determination based on predefined settings of playback facility 104.

As another example, certain media content management operations may be performed by management facility 102 in a way that processes or at least facilitates processing of linked media content instances as an indivisible block of linked media content instances. To illustrate, a user may provide input to define a new playlist of songs selected from media content library 202 shown in FIG. 4. In particular, the user may provide input indicating that song 206-2 is to be added to the new playlist. Management facility 102 may detect the request, detect a link (e.g., line 402) between song 206-2 and song 206-8 in library 202, and in response to and based on the detected link, facilitate an addition of song 206-8 to the new playlist along with song 206-2. For example, management facility 102 may automatically add song 206-8 to the new playlist in response to song 206-2 being added to the playlist and based on the link between songs 206-2 and 206-8. As another example, management facility 102 may provide a prompt to a user that facilitates convenient addition of song 206-8 to the new playlist along with song 206-2. For instance, the prompt may notify the user that song 206-8 is linked to song 206-2 and prompt the user to provide input indicating whether the user would like song 206-8 to follow song 206-2 into the new playlist.

To illustrate another example, a user may provide input indicating that song 206-2 is to be removed from playlist 204. Management facility 102 may detect the request, detect a link between song 206-2 and song 206-8, and in response to and based on the detected link, facilitate removal of song 206-8 along with song 206-2. For example, management facility 102 may automatically remove song 206-8 from playlist 204 in response to song 206-2 being removed from playlist 204 and based on the link between songs 206-2 and 206-8. As another example, management facility 102 may provide a prompt to a user that facilitates convenient removal of song 206-8 from playlist 204 along with song 206-2. For instance, the prompt may notify the user that song 206-8 is linked to song 206-2 and prompt the user to provide input indicating whether the user would like song 206-8 to follow song 206-2 in removal from playlist 204.

To further illustrate one or more of the media content linking services, features, functions, and/or user interfaces that may be associated with the methods and systems described herein, FIGS. 5-9 show exemplary GUIs that may be provided by user interface facility 106.

Figure 5:
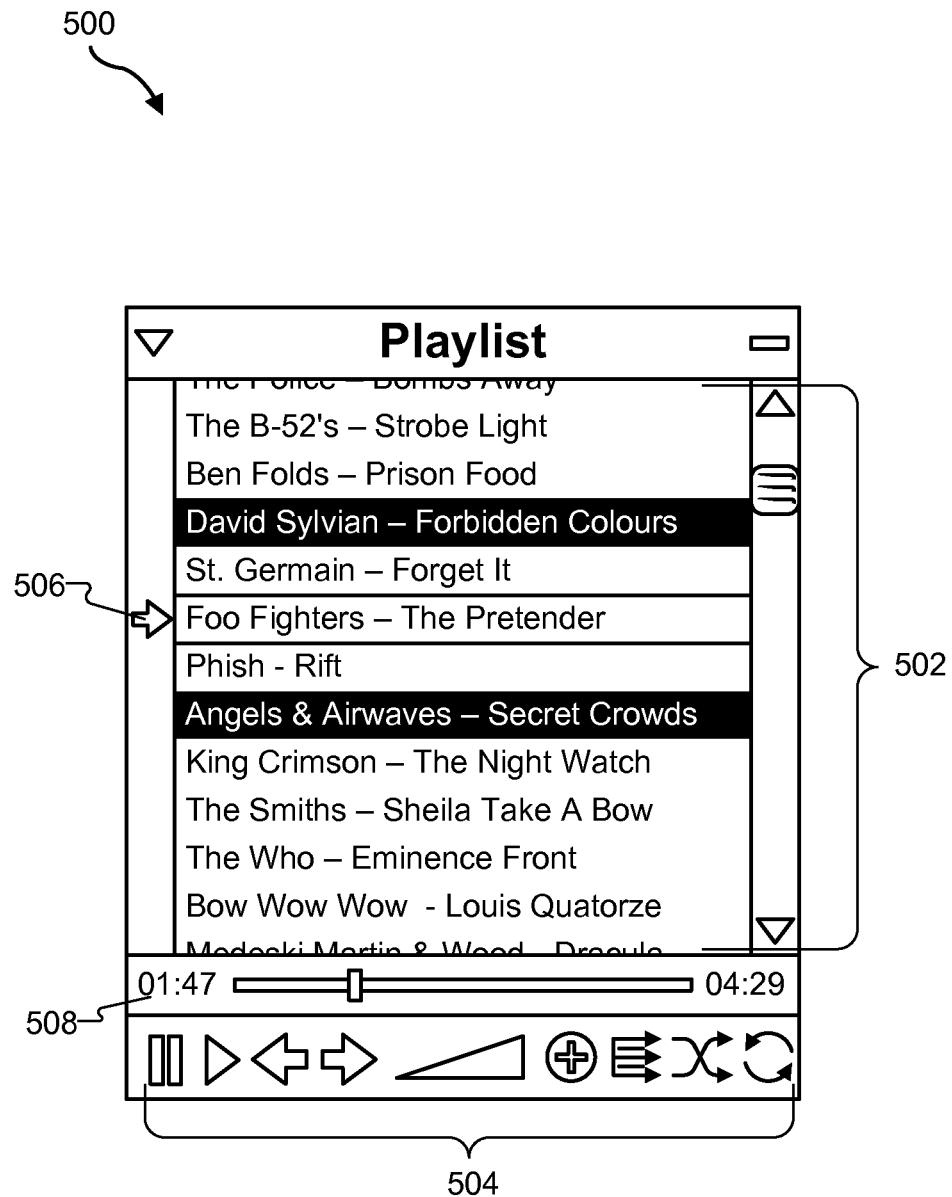
FIGS. 5-11 illustrate exemplary graphical user interfaces according to principles described herein.

FIG. 5 illustrates a playlist playback GUI 500 in which a list 502 of songs included in a playlist are displayed. As shown, GUI 500 may further include a set 504 of playback control options that may be selected by a user to control playback of the playlist. GUI 500 may further display a song playback indicator 506 that indicates the song currently being played back and a playback bar 508 that indicates the current status of playback of the song currently being played back.

GUI 500 may include one or more media management tools configured to facilitate linking together of one or more of the songs included in the playlist. In certain embodiments, for example, a user may provide input to select one or more of the songs included in the playlist and to indicate that the user would like to link together the selected songs. The user input may be provided in any suitable way, such as by the user touching screen areas that are proximate to visual data representative of one or more songs on a touch screen for a predetermined length of time (e.g., by pressing and holding for a predetermined duration). For instance, a user may touch two songs titled "Forbidden Colors" and "Secret Crowds." The touch selection may be concurrent or sequential. In certain embodiments, the sequence in which the songs are selected may be used by management facility 102 to determine a direction of linking to be generated between the songs.

The touch selection of the songs may be visually indicated in GUI 500, such as by highlighting the data representative of the selected songs and/or areas of the screen that are proximate the data representative of the selected songs, as shown in FIG. 5. Other visual indicators of the selection of songs may be used in other examples.

While the above example describes touch screen "press and hold" input to select songs to be linked together, this is illustrative only. Any suitable form of user input may be used, including selection of a linking icon to indicate a desire to link together selected songs and/or any other suitable form of user input.

Figure 6:
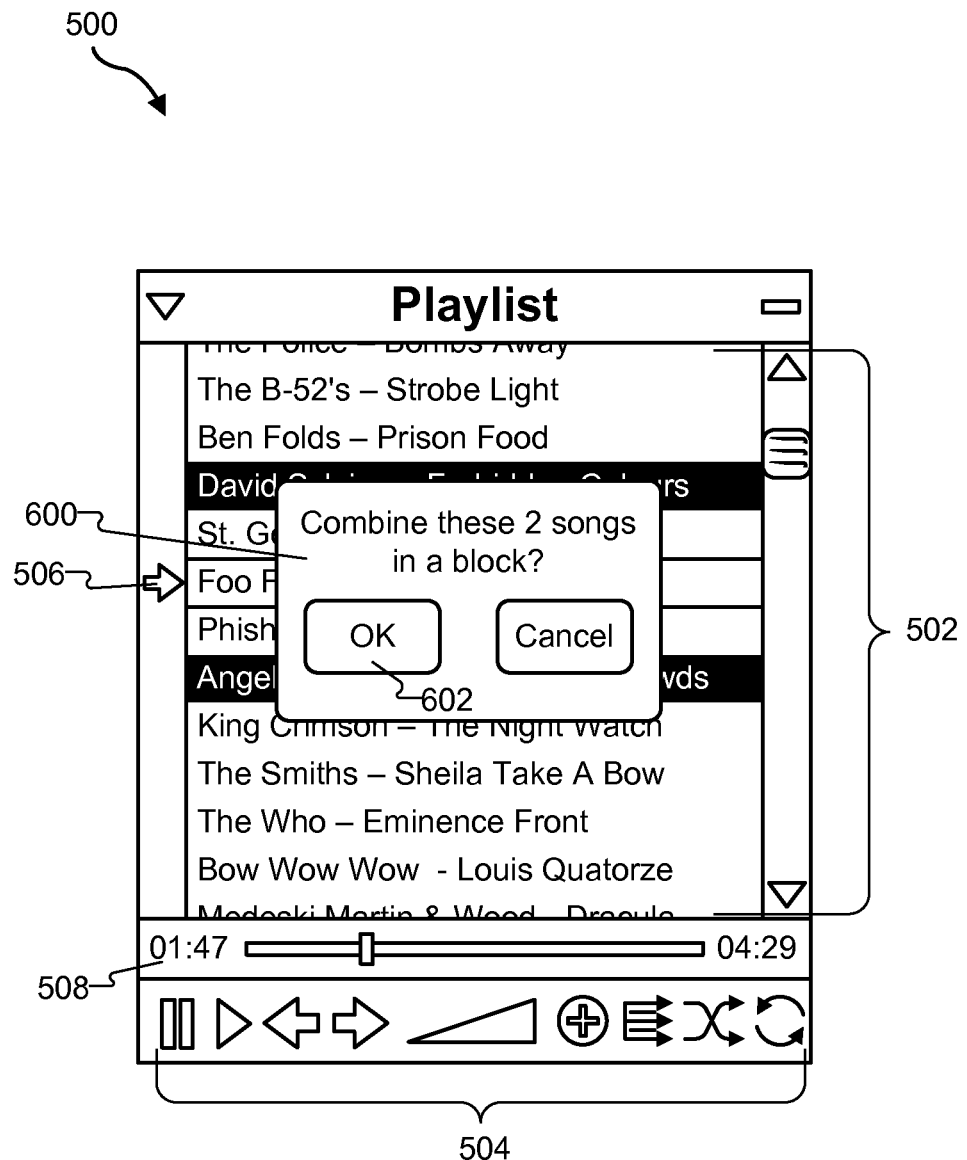

In certain embodiments, management facility 102 may detect that the user has provided input indicative of a desire for songs to be linked together. In response, management facility 102 may automatically link together the selected songs in any of the ways described herein. In other examples, management facility 102 may prompt the user to provide additional input to confirm whether the user would like the selected songs to be linked together. For example, FIG. 6 illustrates a pop-up window 600 displayed for viewing by the user. Pop-up window 600, which may be displayed as an overlay to GUI 500, may display text asking the user whether to link the selected songs and provide options configured to be selected by the user to indicate whether to link or not link the songs together. In response to a user selection of an "OK" button 602 included in pop-up window 600, management facility 102 may link together the selected songs in any of the ways described herein.

While FIGS. 5-6 illustrate a user selection of two songs in a playlist to be linked together, this is illustrative only. Other user interfaces may facilitate user selection of any number of songs from a playlist and/or from a library for linking. For example, a user may select a first song included in playlist 204. With that song selected, the user may access and search library 202 to identify and select a second song to be linked to the first song in playlist 204. The user may then provide an input command to link together the two songs, and management facility 102 may respond by adding the second song to playlist 204 and creating a link between the two songs in playlist 204.

Figure 7:
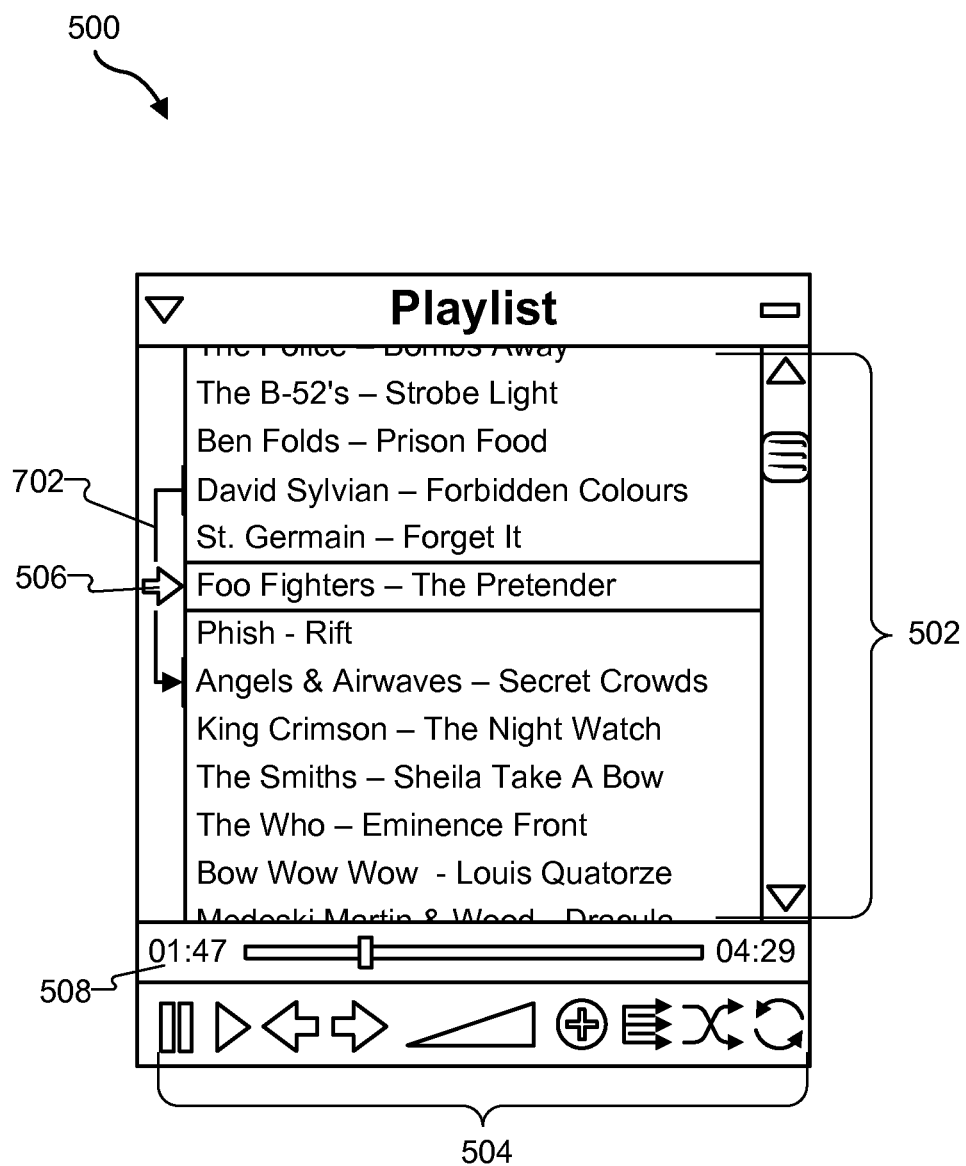

User interface facility 106 may provide, within a user interface, an indication that media content instances are linked. For example, FIG. 7 illustrates GUI 500 after the selected songs have been linked together by management facility 102. As shown, GUI 500 may include a visual indicator 702 in the form of a connector line between the linked songs that visually indicates the existence of a link between the linked songs. Visual indicator 702 is illustrative only. Other suitable visual indicators may be used to visually indicate blocks of linked media content instances in other embodiments. Examples of such visual indicators include, without limitation, different text and/or spacing attributes (e.g., italics, indentations, etc.), link icons, and temporary rearrangement of data representative of songs within a list of songs (e.g., shifting linked songs to be adjacent to one another in a list and graying out the previous positions of the songs in the list).

Figure 8:
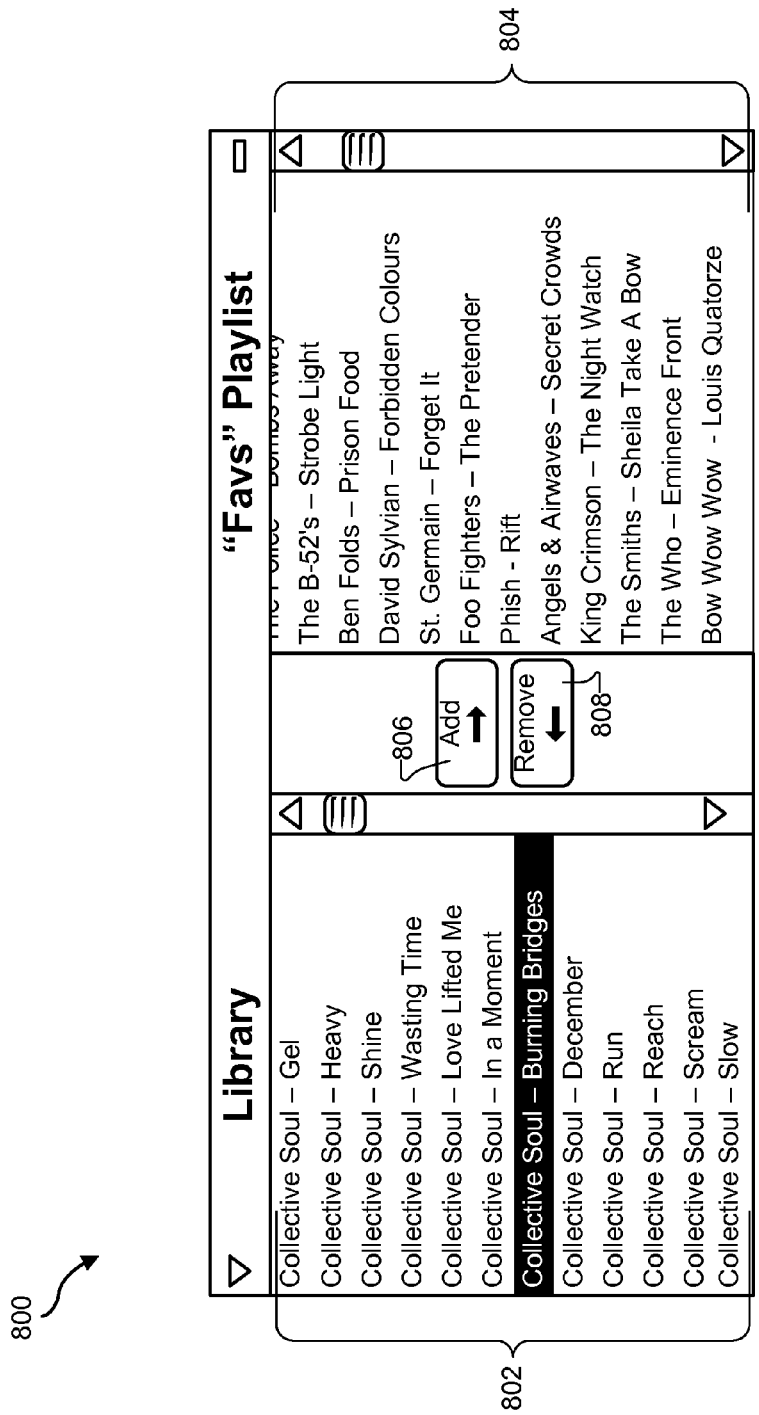

As another example of a user interface that may be provided by user interface facility 106, FIG. 8 illustrates a playlist management GUI 800 in which a list 802 of songs included in a music library and a list 804 of songs included in a playlist are displayed. GUI 800 may further include one or more media management tools (e.g., playlist management tools) for use by a user to manage a playlist. For example, GUI 800 may include an add tool 806 configured to be selected by a user to add a song selected in list 802 to the playlist. GUI 800 may also include a remove tool 808 configured to be selected by a user to remove a song selected in list 804 from the playlist.

Figure 9:
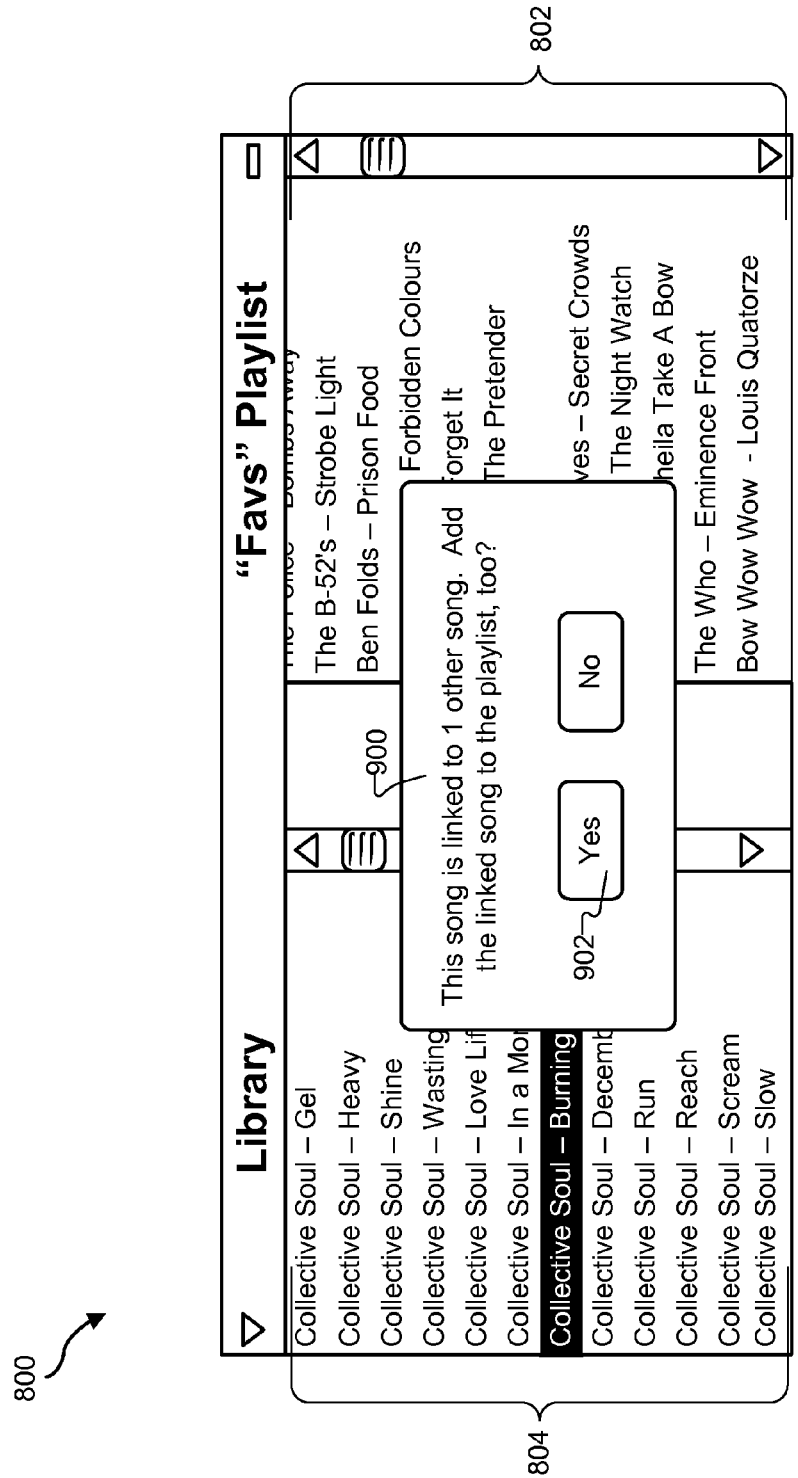

If a user provides a user input command to add a selected song to the playlist (e.g., by selecting add tool 806) and the selected song is included in a block of linked songs in the music library, system 100 may detect the user input command and the link and, in response, facilitate processing of the selected song as part of a block. In certain embodiments, for example, management facility 102 may automatically add the selected song and any other songs linked to the selected song to the playlist as a block of linked songs. In other embodiments, user interface facility 106 may provide a prompt notifying the user that the selected song is linked to one or more other songs and prompting the user to provide additional input indicating whether the other songs are to be added to the playlist together with the selected song. For example, FIG. 9 illustrates a pop-up window 900 displayed for viewing by the user. Pop-up window 900, which may be displayed as an overlay to GUI 800, may display text notifying the user that the selected song is linked to one or more other songs and asking the user whether to add the linked songs to the playlist together with the selected song. Pop-up window 900 may also provide options configured to be selected by the user to indicate whether to add or not add the linked songs to the playlist together with the selected song. In response to a user selection of a "Yes" button 902 included in pop-up window 900, management facility 102 may add the selected song and the linked songs to the playlist. In certain examples, the link between the added songs may be carried through to the playlist such that the songs are added to the playlist as a block of linked songs.

In some examples, processing of linked media content instances as blocks of linked media content instances may create potential conflicts between different blocks of linked media content instances. To illustrate, within playback of a playlist, a first song selected for playback may be part of two different blocks of linked songs. For instance, the first song may be linked to a second song in one block and to a third song in another block. This may create a potential conflict between the two blocks of songs.

In certain embodiments, system 100 may be configured to handle such potential conflicts by using a predefined prioritization heuristic that specifies one or more rules for prioritizing one block over another block. In certain examples, the heuristic may specify that a block created in response to manual user input is to be prioritized over a block created automatically in response to an operation of system 100 such as in response to optimization of songs for gapless playback, as described above. In certain examples, the heuristic may specify that a more recently created block is to be prioritized over an earlier created block. Accordingly, system 100 may use the heuristic to resolve potential conflicts, such as by prioritizing blocks for processing.

Additionally or alternatively to the media content linking services, features, functions, and/or user interfaces described herein, system 100 may provide services, features, functions, and/or user interfaces related to managing media content within a digital media content library and/or playlist "on the fly" within a context of a playback of media content (e.g., during playback of media content and/or by way of a playback user interface that is presented in conjunction with playback of media content). In certain embodiments, "on the fly" management of media content may be performed within the context of media content playback, without a user having to move away from a playback user interface to access a separate media content management user interface (e.g., a playlist edit mode user interface). Such "on the fly" management of media content may provide a user with increased and/or more convenient and user-friendly control over management of media content and/or playlists during playback of media content as compared to conventional media players.

To illustrate, during playback of media content (e.g., during playback of a song and/or a playlist), system 100 may present a playback user interface that includes one or more media management tools in the form of one or more selectable options that may be selected by a user to initiate performance of one or more corresponding media management operations by system 100. During the playback, system 100 may detect a user selection of one of the selectable options and, in response to the detection, perform one or more media management operations corresponding to the selected option. Exemplary selectable options and corresponding media management operations will now be described.

In certain examples, during playback of a playlist, the playback user interface may include a selectable option to instantly delete a media content instance from the playlist. In response to a user selection of the option, system 100 may delete an identified media content instance (e.g., the media content instance currently being played back or another media content instance that is selected when the user selects the option) from the playlist.

In certain examples, during playback of a playlist, the playback user interface may include a selectable option to temporarily disable a media content instance included in the playlist. In response to user selection of the option, system 100 may temporarily disable an identified media content instance (e.g., the media content instance currently being played back or another media content instance that is selected when the user selects the option) such that the media content instance will be prevented from being played back during the current playback session of the playlist. The disabling of the media content instance may be temporary in that it applies only to the current playback session of the playlist. After the current playback session terminates (e.g., system 100 terminates the current playback session to perform another playback operation not related to the playlist, such as playing back another media content instance and/or playlist), system 100 may detect the termination and, in response to the detection, may re-enable the media content instance such that the media content instance will be allowed to be played back (e.g., will not be prevented from being played back) in a subsequent playback of the playlist.

In certain examples, during playback of a media content instance (e.g., playback of the media content instance individually or as part of a playback of a media content library or playlist), the playback user interface may include a selectable option to instantly add the media content instance to a playlist (e.g., a new or existing playlist). In response to a user selection of the option, system 100 may add the media content instance to a playlist. In some examples, system 100 may prompt the user for input indicating a desired existing or new playlist to which to add the media content instance.

In certain examples, during playback of a media content instance (e.g., playback of the media content instance individually or as part of a playback of a media content library or playlist), the playback user interface may include a selectable option that may be selected by a user to select (e.g., bookmark) a media content instance for additional processing. In response to user selection of the option, system 100 may provide one or more additional selectable options for the additional processing of the media content instance. The additional selectable options may include an option to add the media content instance to a playlist (e.g., a new playlist or an existing playlist), an option to access information about the media content instance (e.g., additional information about the artist of the media content instance), and an option to generate and automatically populate a new playlist based on the media content instance. In response to a user selection of the option to add the media content instance to a playlist, system 100 may perform one or more operations to add the media content instance to a playlist, as described above. In response to a user selection of the option to access information about the media content instance, system 100 may access and present information about the media content instance. In response to a user selection of the option to generate and automatically populate a new playlist based on the media content instance, system 100 may automatically create a new playlist, add the media content instance to the playlist, and automatically add one or more other media content instances that are determined by system 100 to be similar to the media content instance to the playlist. In certain examples, the new playlist may be created to have a length (e.g., playback duration) that is approximately the same as and not greater than a predetermined length.

Figure 10:
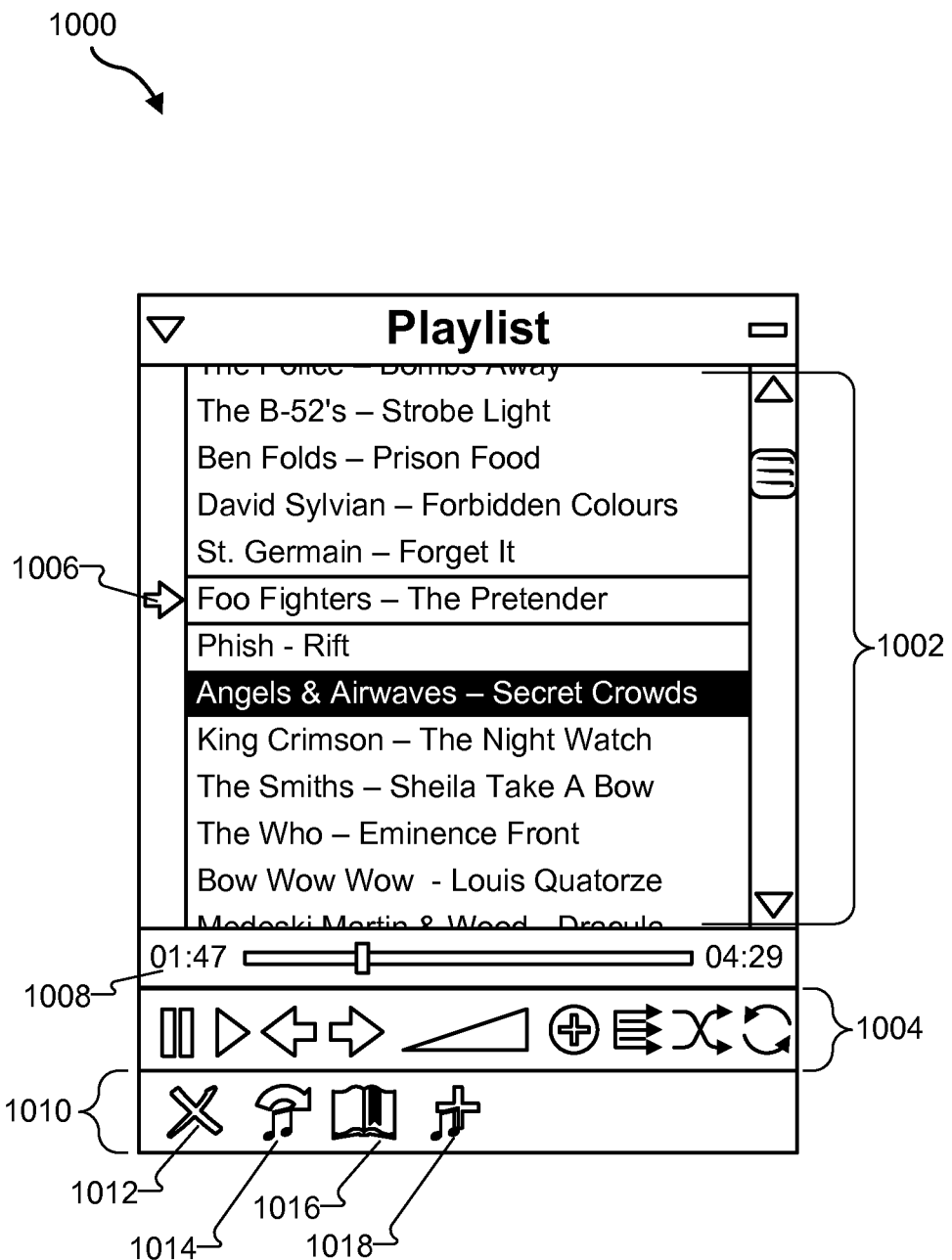
Figure 11:
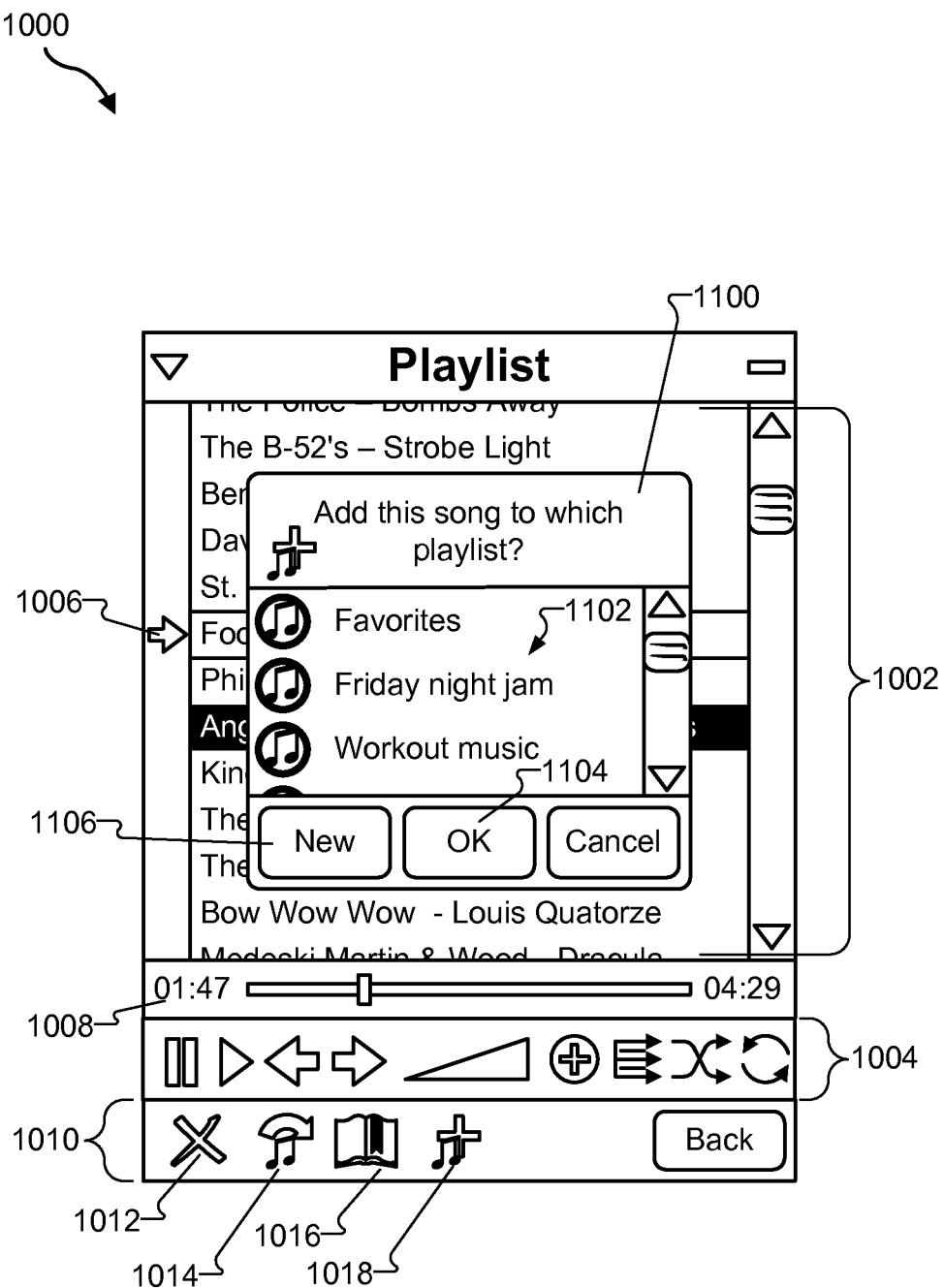

To further illustrate one or more of the "on the fly" media management services, features, functions, and/or user interfaces described herein, FIGS. 10-11 show exemplary GUIs that may be provided by user interface 106.

FIG. 10 illustrates a playlist playback GUI 1000 that may be presented by user interface 106 during playback of a playlist. As shown, GUI 1000 may include a list 1002 of songs included in a playlist and a set 1004 of playback control options that may be selected by a user to control playback of the playlist. GUI 1000 may further display a song playback indicator 1006 that indicates the song currently being played back and a playback bar 1008 that indicates the playback status of the song currently being played back.

GUI 1000 may further include a set 1010 of one or more media management tools in the form of options that may be selected by a user to manage a selected song included in the playlist. For example, a user may select option 1012 to delete the selected song from the playlist, option 1014 to temporarily disable the selected song from the playlist, option 1016 to select (e.g., bookmark) the selected song for additional processing, and option 1018 to add the selected song to another playlist (e.g., a new or another existing playlist), such as described above.

A particular song included in the playlist may be selected in any suitable way. In certain examples, the currently playing song may be processed as the selected song. In other examples, the user may provide input selecting a different song in the playlist. To illustrate, FIG. 10 shows a song titled "Secret Crowds" to be highlighted to indicate that it has been selected by a user.

Upon selection of one of the options included in set 1010, system 100 may perform one or more operations to manage the selected song. To illustrate, in response to a user selection of option 1018 to add the selected song to another playlist, user interface facility 106 may provide one or more additional tools and/or options for use by the user to select a playlist to which to add the selected song. FIG. 11 illustrates a pop-up window 1100 that may be displayed by user interface facility 106 in response to a user selection of option 1018 in GUI 1000. Pop-up window 1100, which may be displayed as an overlay to GUI 800, may include text asking the user to select a playlist to which to add the selected song. Pop-up window 1100 may also include a list 1102 of existing playlists from which the user may select a particular playlist to which the selected song will be added. The addition of the song to the playlist may be invoked by the user selecting the playlist from list 1102 and then an "OK" button 1104. Pop-up window 1100 may also include an option to add the selected song to a new playlist. For example, the user may select a "New" button 1106 to launch one or more tools for use by the user to create a new playlist to which the selected song will be added.

While FIGS. 10-11 illustrate an exemplary playlist playback GUI in list format, this is illustrative only. One or more of the media management tools described herein may be provided within one or more other playback user interfaces. For example, one or more of the media management tools may be provided within a full-screen format playback GUI, such as a full-screen song playback GUI.

System 100 may provide the above-described media management tools for use within the context of playback of media content. Accordingly, the tools may facilitate user management of media content, including management of playlists, within the context of playback of media content. In certain examples, the tools may allow the user to manage media content as described above without leaving a playback user interface that is presented in conjunction with playback of media content to access a separate media management user interface.

Figure 12:
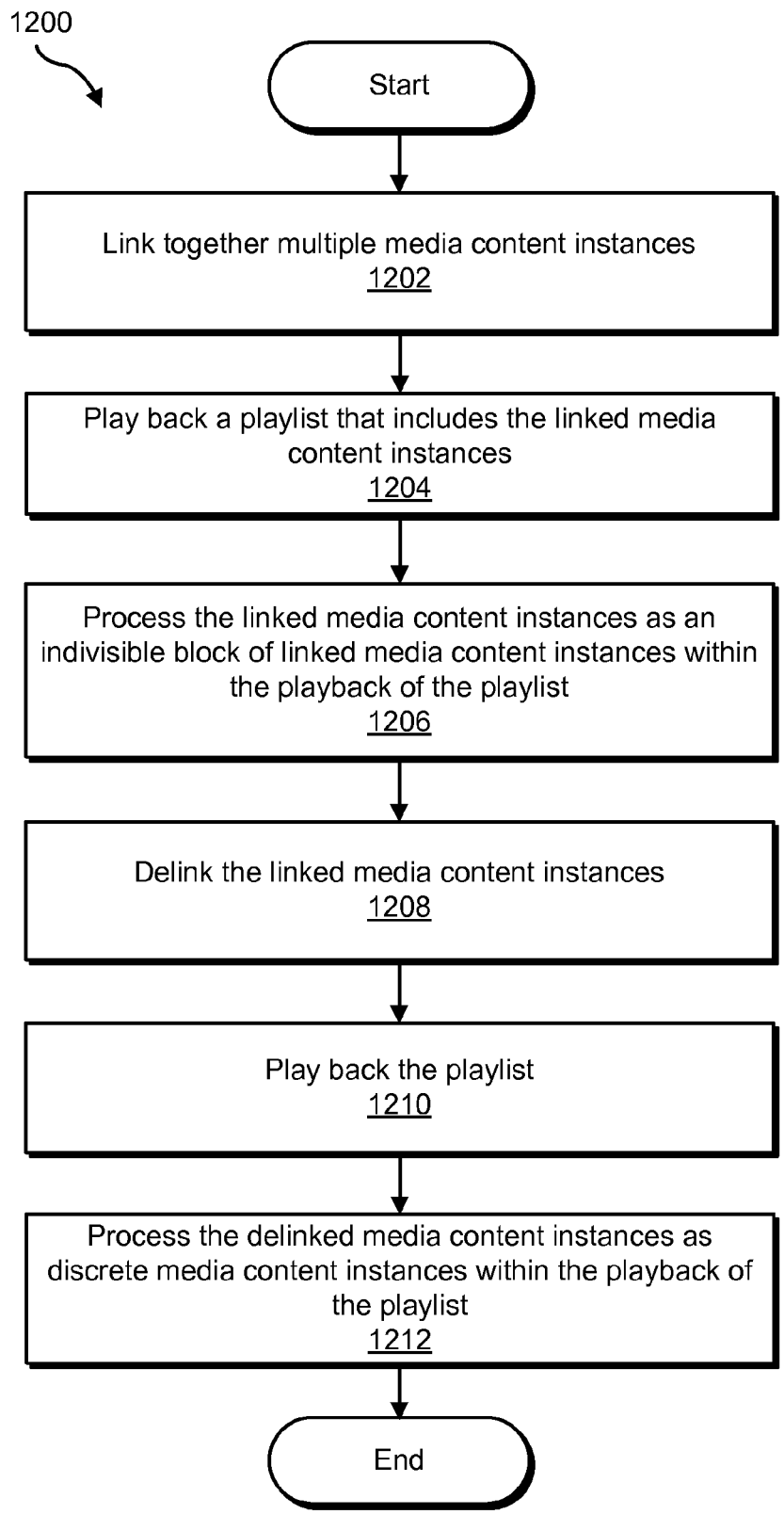
FIGS. 12-14 illustrate exemplary media content management and presentation methods according to principles described herein.
Figure 13:
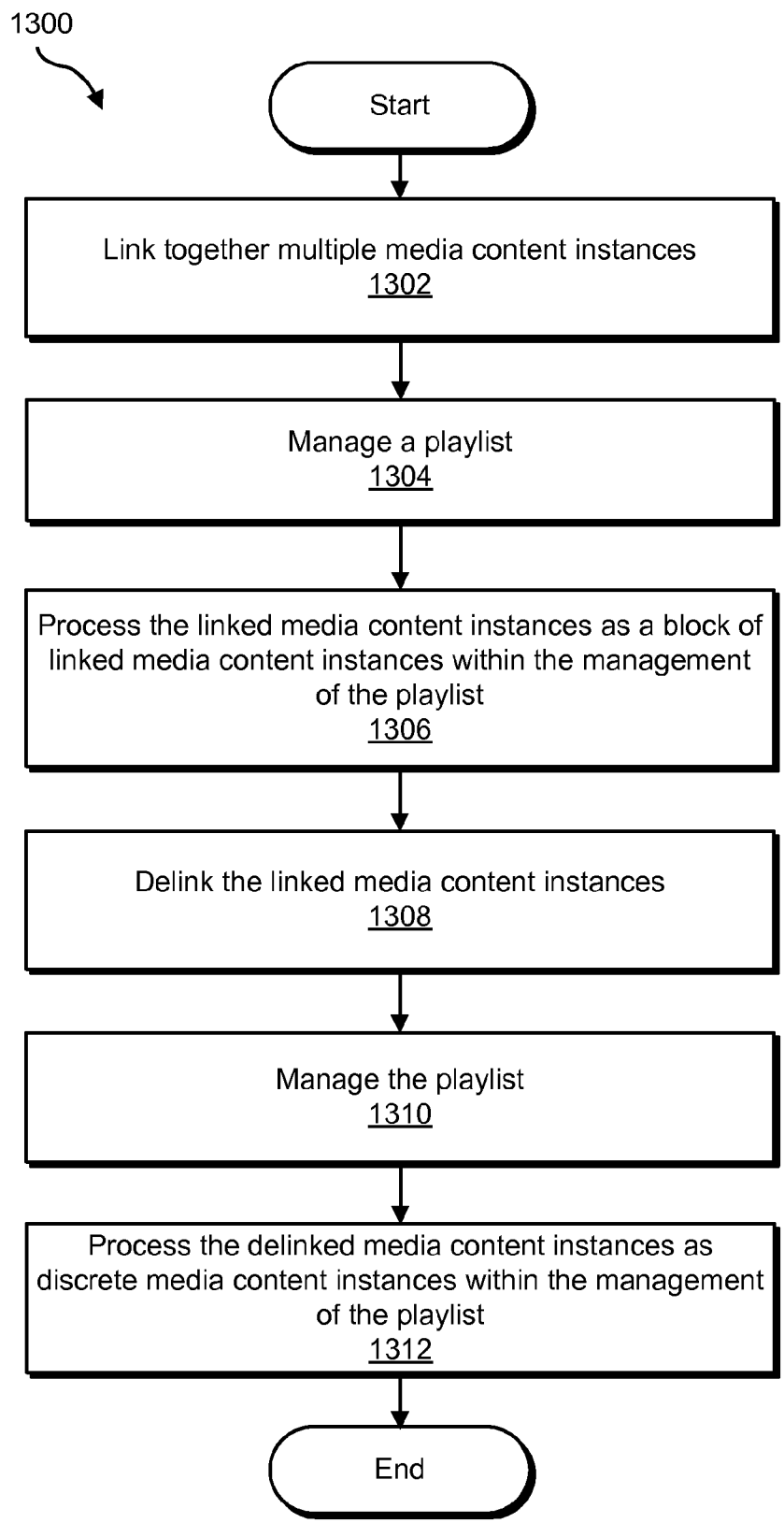
Figure 14:
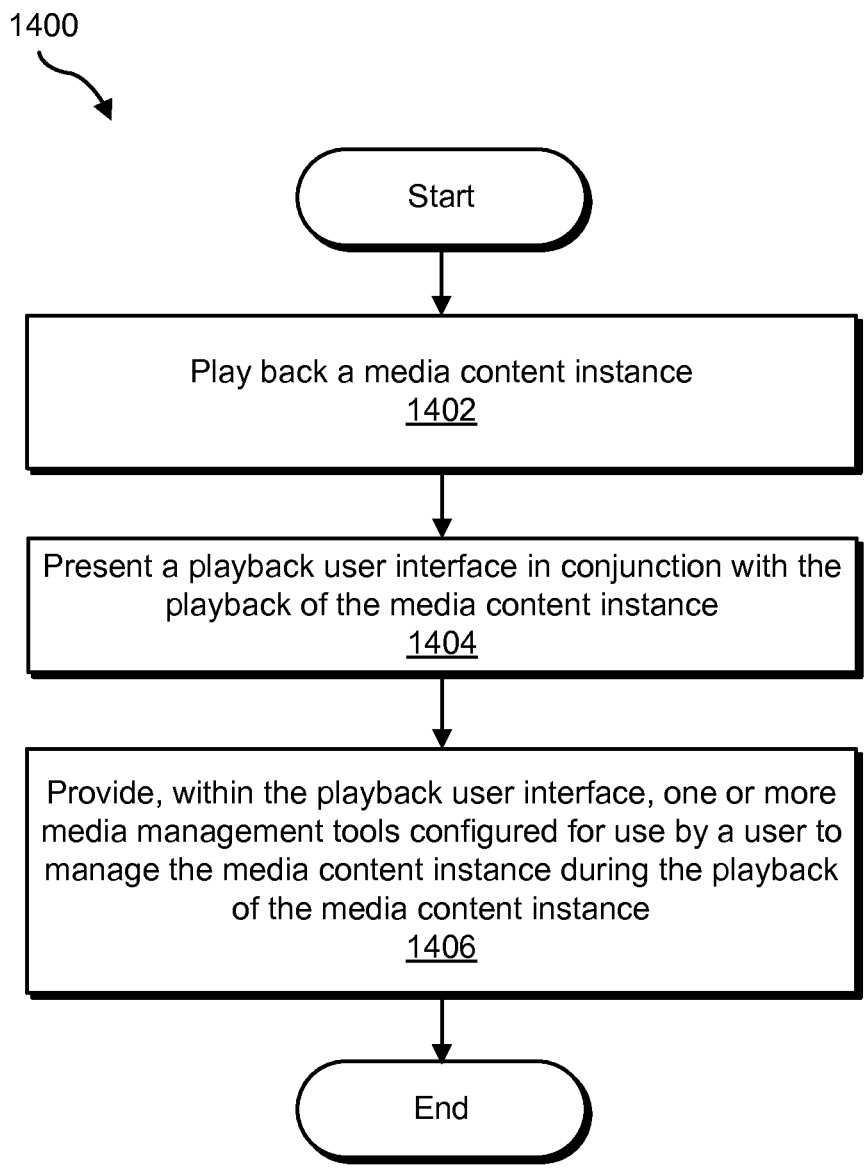

FIGS. 12-14 illustrate exemplary media content management and presentation methods 1200, 1300, and 1400 according to principles described herein. While FIGS. 12-14 illustrate exemplary steps according to certain embodiments, other embodiments may omit, add to, reorder, combine, and/or modify any of the steps shown in FIGS. 12-14. In certain embodiments, one or more of the steps shown in FIGS. 12-14 may be performed by system 100 and/or any components and/or implementation thereof.

Turning to method 1200 in FIG. 12, in step 1202, system 100 links together multiple media content instances. Step 1202 may be performed in any of the ways described herein.

In step 1204, system 100 plays back a playlist that includes the linked media content instances. Step 1204 may be performed in any of the ways described herein and may include sequential or random playback of the playlist.

In step 1206, system 100 processes the linked media content instances as an indivisible block of linked media content instances within the playback of the playlist. Step 1206 may be performed in any of the ways described herein. For example, within a random playback of the playlist, the processing may include processing the linked media content instances as an indivisible block of linked media content instances within the randomizing of the playback of the playlist (e.g., within the random selection of media content instances for playback).

In step 1208, system 100 delinks the link media content instances. Step 1208 may be performed in any of the ways described herein.

In step 1210, system 100 plays back the playlist. Step 1210 may be performed in any of the ways described herein and may include a sequential or random playback of the playlist.

In step 1212, system 100 processes the delinked media content instances as discrete media content instances within the playback of the playlist. Step 1212 may be performed in any of the ways described herein. For example, for a random playback of the playlist, the processing may include processing the delinked media content instances as discrete media content instances within the randomizing of the playback of the playlist.

Turning to method 1300 in FIG. 13, in step 1302, system 100 links together multiple media content instances. Step 1302 may be performed in any of the ways described herein. For example, system 100 may link together multiple media content instances included in a digital media content library.

In step 1304, system 100 manages a playlist. For example, system 100 may perform a management operation to manage a playlist associated with the digital media content library. Examples of a management operation may include adding a media content instance to the playlist or removing a media content instance from the playlist.

In step 1306, system 100 processes the linked media content instances as a block of linked media content instances within the management of the playlist. For example, system 100 may process the linked media content instances as a block of linked media content instances within the management operation performed to manage the playlist (e.g., adding or removing to/from the playlist). Step 1306 may be performed in any of the ways described above. For example, system 100 may facilitate addition or removal of linked media content instances to/from the playlist as a block of linked media content instances.

In step 1308, system 100 delinks the linked media content instances. Step 1308 may be performed in any of the ways described herein.

In step 1310, system 100 manages a playlist. For example, system 100 may perform a management operation to manage a playlist associated with the digital media content library, such as described above.

In step 1312, system 100 processes the delinked media content instances as discrete media content instances within the management of the playlist. For example, system 100 may process the linked media content instances as discrete media content instances within the management operation performed to manage the playlist (e.g., by adding or removing individual media content instances to/from the playlist). Step 1312 may be performed in any of the ways described above.

Turning to method 1400 in FIG. 14, in step 1402, system 100 plays back a media content instance for experiencing by a user. Step 1402 may be performed in any of the ways described herein.

In step 1404, system 100 presents a playback user interface in conjunction with the playback of the media content instance. Step 1404 may be performed in any of the ways described herein, and the playback user interface may include any of the exemplary playback user interfaces described herein.

In step 1406, system 100 provides, within the playback user interface, one or more media management tools configured for use by the user to manage the media content instance during the playback of the media content instance. Step 1406 may be performed in any of the ways described herein, and the media management tools may include any of the exemplary media management tools described herein.

Figure 15:
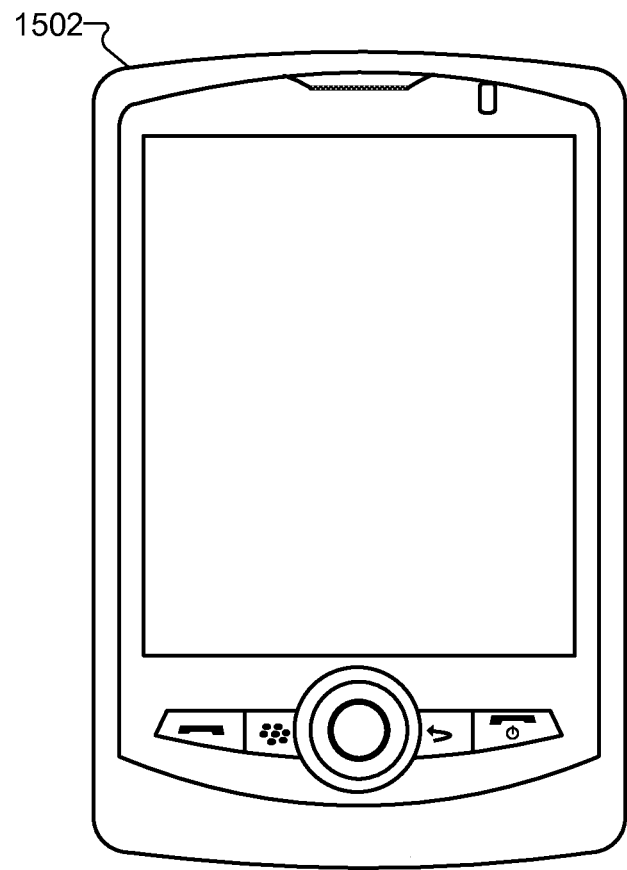
FIGS. 15-17 illustrate exemplary implementations of the system of FIG. 1 according to principles described herein.

System 100 may include or be implemented by one or more computing devices. In certain embodiments, system 100 may include or be implemented by a single computing device. For example, FIG. 15 illustrates an exemplary mobile user device 1502 that implements system 100. In such an implementation, media content may be stored, managed, accessed, played back, and/or otherwise processed locally by user device 1502 in any of the ways described herein. Mobile user device 1502 may provide one or more user interfaces through which a user mobile user device 1502 may interface with system 100. System 100 may be implemented by mobile user device 1502 in any suitable way, including as part of a native operation system or an application (e.g., a software or firmware application) running on mobile user device 1502.

While FIG. 15 shows a mobile user device 1502, this is illustrative only. System 100 may be implemented by any suitable computing device, including, without limitation, a mobile phone, a mobile media player device, a personal computer, a tablet computer, etc.

Figure 16:
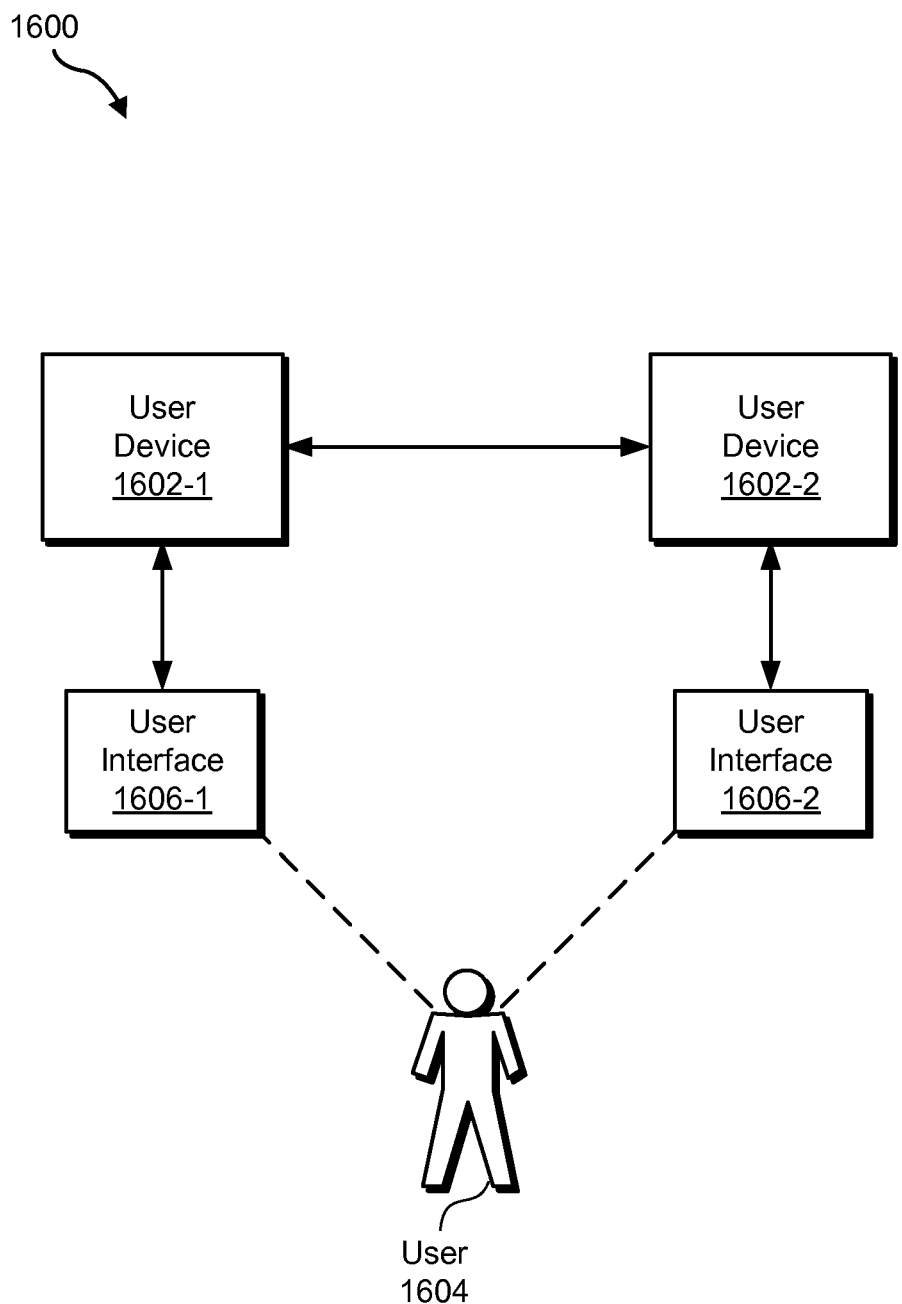

In certain embodiments, system 100 may include or be implemented by and/or across multiple computing devices. For example, FIG. 16 illustrates an exemplary implementation 1600 of system 100 wherein a user device 1602-1 and another user device 1602-2 (collectively "user devices 1602") are configured to communicate directly with one another. In implementation 1600, certain components of system 100 may be implemented on user device 1602-1 and certain components of system 100 may be implemented on user device 1602-2, or system 100 may be implemented by each user device 1602. Implementation 1600 may include a configuration in which user device 1602-1 is tethered to user device 1602-2 for certain operations of system 100. For example, user device 1602-2 may maintain data representative of a master digital media content library. User device 1602-1 may interface with user device 1602-2 to sync the media content stored locally on user device 1602-1 to all or select portions of the master digital media content library maintained by user device 1602-2. Each user device 1602 may perform any of the operations of system 100.

As shown in FIG. 16, user devices 1602 may be associated with (e.g., operated by) a user 1604, who may interact with system 100, in any of the ways described herein, through a user interface 1606-1 provided by user device 1602-1 and/or a user interface 1606-2 provided by user device 1602-2. Each of the user interfaces 1606-1 and 1606-2 may include or provide any of the exemplary GUIs described herein.

Figure 17:
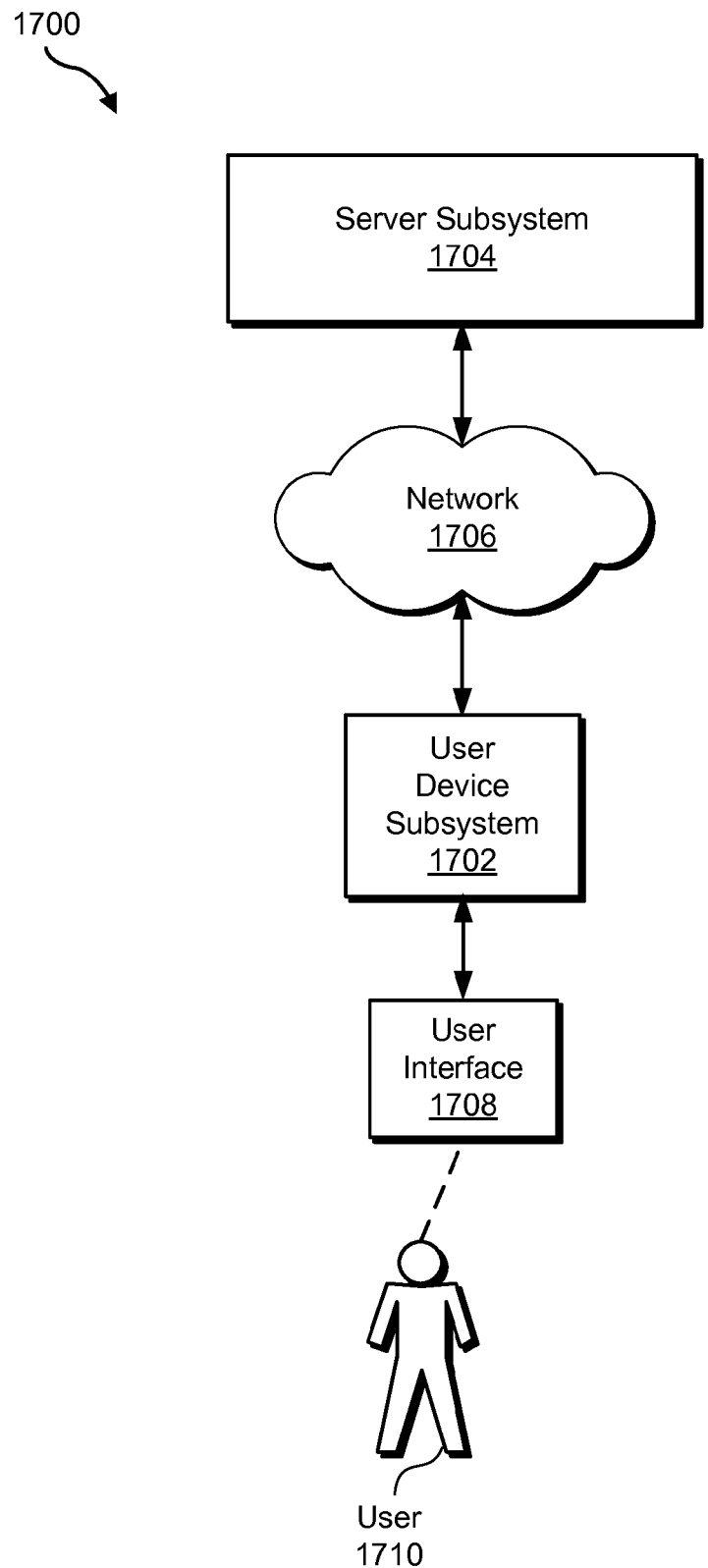

FIG. 17 illustrates an exemplary implementation 1700 of system 100 wherein a user device subsystem 1702 (which may include one or more user devices such as user devices 1502 and 1602) is configured to communicate with a server subsystem 1704 by way of a network 1706.

In implementation 1700, system 100 may be implemented by user device subsystem 1702 and/or server subsystem 1704. Accordingly, user device subsystem 1702, server subsystem 1704, or a combination thereof may perform any of the operations of system 100.

User device subsystem 1702 may communicate with server subsystem 1704 using any suitable communication technologies. Examples of such communication technologies may include, without limitation, Global System for Mobile Communications ("GSM") technologies, Long Term Evolution ("LTE") technologies, Code Division Multiple Access ("CDMA") technologies, Time Division Multiple Access ("TDMA") technologies, Evolution Data Optimized Protocol ("EVDO") (e.g., "1xEVDO"), radio frequency ("RF") signaling technologies, radio transmission technologies (e.g., One Times Radio Transmission Technology ("1xRTT")), Transmission Control Protocol ("TCP"), Internet Protocol ("IP"), Session Initiation Protocol ("SIP"), Real-Time Transport Protocol ("RTP"), User Datagram Protocol ("UDP"), in-band and out-of-band signaling technologies, and other suitable video data transport technologies, or any combination or sub-combination thereof.

Network 1706 may include any network or combination of networks provided by one or more appropriately configured network devices (and communication links thereto) and over which communications and data may be transported between server subsystem 1704 and user device subsystem 1702. For example, network 1706 may include, but is not limited to, a mobile phone network (e.g., a cellular phone network, an LTE network, a 3G network, a 4G network, etc.), a satellite media network (e.g., a broadcasting network, a terrestrial media broadcasting network), a cable network, an optical fiber network, a hybrid fiber coax network, a wireless network (e.g., a Wi-Fi and/or mobile telephone network), a subscriber television network, a wide area network the Internet, an intranet, a local area network, any other network suitable for supporting a hosted media management and/or presentation service.

Server subsystem 1702 may include one or more computing devices (e.g., one or more server devices) configured to perform functionality of system 100 described herein. The computing devices may include and/or be implemented by one or more network devices of network 1706 and/or may be configured to communicate with one or more network devices of network 1706. In certain examples, the computing devices may be operated by the operator of network 1706 and/or a hosted media management service provider.

Server subsystem 1704 may provide one or more functions of system 100 as a service for access and use by user device subsystem 1702. For example, server subsystem 1704 may store media content at a hosted data center for access by user device subsystem 1702. Functionality of system 100 described herein may be accessible as one or more web services provided by server subsystem 1704 and/or as client application functionality implemented by user device subsystem 1702. User device subsystem 1702 may provide a user interface 1708 through which a user 1710 may interact with system 100. User interfaces 1708 may include or provide any of the exemplary GUIs described herein.

In certain embodiments, one or more of the components and/or processes described herein may be implemented and/or performed by one or more appropriately configured computing devices. To this end, one or more of the systems and/or components described above may include or be implemented by any computer hardware and/or computer-implemented instructions (e.g., software) embodied on at least one non-transitory computer-readable medium configured to perform one or more of the processes described herein. In particular, system components may be implemented on one physical computing device or may be implemented on more than one physical computing device. Accordingly, system components may include any number of computing devices, and may employ any of a number of computer operating systems.

In certain embodiments, one or more of the processes described herein may be implemented at least in part as instructions executable by one or more computing devices. In general, a processor (e.g., a microprocessor) receives instructions, from a tangible computer-readable medium, (e.g., a memory, etc.), and executes those instructions, thereby performing one or more processes, including one or more of the processes described herein. Such instructions may be stored and/or transmitted using any of a variety of known non-transitory computer-readable media.

A non-transitory computer-readable medium (also referred to as a processor-readable medium) includes any non-transitory medium that participates in providing data (e.g., instructions) that may be read by a computer (e.g., by a processor of a computer). Such a non-transitory medium may take many forms, including, but not limited to, non-volatile media and/or volatile media. Non-volatile media may include, for example, optical or magnetic disks and other persistent memory. Volatile media may include, for example, dynamic random access memory ("DRAM"), which typically constitutes a main memory. Common forms of non-transitory computer-readable media include, for example, a floppy disk, flexible disk, hard disk, magnetic tape, any other magnetic medium, a CD-ROM, DVD, any other optical medium, a RAM, a PROM, an EPROM, a FLASH-EEPROM, any other memory chip or cartridge, or any other non-transitory medium from which a computer can read.

Figure 18:
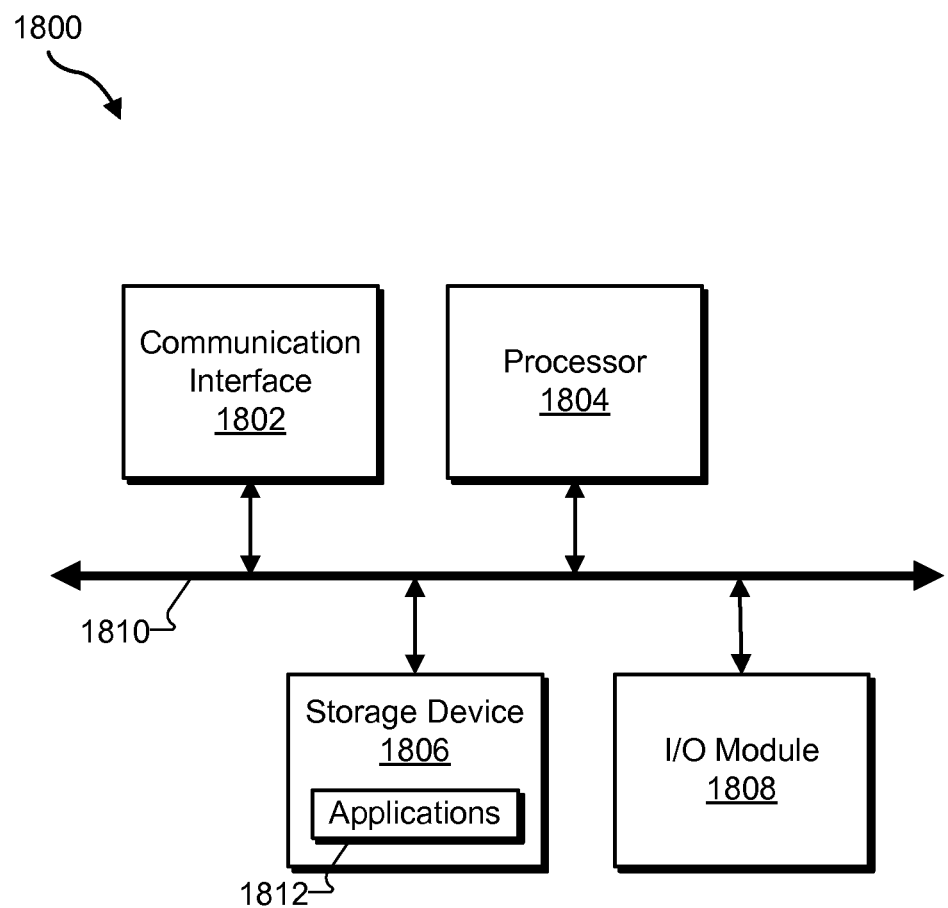
FIG. 18 illustrates an exemplary computing device according to principles described herein.

FIG. 18 illustrates an exemplary computing device 1800 that may be configured to perform one or more of the processes described herein. As shown in FIG. 18, computing device 1800 may include a communication interface 1802, a processor 1804, a storage device 1806, and an input/output ("I/O") module 1808 communicatively connected via a communication infrastructure 1810. While an exemplary computing device 1800 is shown in FIG. 18, the components illustrated in FIG. 18 are not intended to be limiting. Additional or alternative components may be used in other embodiments. Components of computing device 1800 shown in FIG. 18 will now be described in additional detail.

Communication interface 1802 may be configured to communicate with one or more computing devices. Examples of communication interface 1802 include, without limitation, a wireless network interface (such as a wireless network interface card), a modem, and any other suitable interface. Communication interface 1802 may be configured to interface with any suitable communication media, protocols, and formats.

Processor 1804 generally represents any type or form of processing unit capable of processing data or interpreting, executing, and/or directing execution of one or more of the instructions, processes, and/or operations described herein. Processor 1804 may direct execution of operations in accordance with one or more applications 1812 or other computer-executable instructions such as may be stored in storage device 1806 or another non-transitory computer-readable medium.

Storage device 1806 may include one or more data storage media, devices, or configurations and may employ any type, form, and combination of data storage media and/or device. For example, storage device 1806 may include, but is not limited to, a hard drive, network drive, flash drive, magnetic disc, optical disc, random access memory ("RAM"), dynamic RAM ("DRAM"), other non-volatile and/or volatile data storage units, or a combination or sub-combination thereof. Electronic data, including data described herein, may be temporarily and/or permanently stored in storage device 1806. For example, data representative of one or more executable applications 1812 (which may include, but are not limited to, one or more of the software applications described herein) configured to direct processor 1804 to perform any of the operations described herein may be stored within storage device 1806. In some examples, data may be arranged in one or more databases residing within storage device 1806.

I/O module 1808 may be configured to receive user input and provide user output and may include any hardware, firmware, software, or combination thereof supportive of input and output capabilities. For example, I/O module 1808 may include hardware and/or software for capturing user input, including, but not limited to, a keyboard or keypad, a touch screen component (e.g., touch screen display), a receiver (e.g., an RF or infrared receiver), and/or one or more input buttons.

I/O module 1808 may include one or more devices for presenting output to a user, including, but not limited to, a graphics engine, a display (e.g., a display screen, one or more output drivers (e.g., display drivers), one or more audio speakers, and one or more audio drivers. In certain embodiments, I/O module 1808 is configured to provide graphical data to a display for presentation to a user. The graphical data may be representative of one or more graphical user interfaces and/or any other graphical content as may serve a particular implementation.

In some examples, any of the facilities described herein may be implemented by or within one or more components of computing device 1800. For example, one or more applications 1812 (e.g., a media player software application) residing within storage device 1806 may be configured to direct processor 1804 to perform one or more processes or functions associated with one or more of the facilities 102-106 of system 100 described herein. Likewise, storage facility 108 of system 100 may be implemented by or within storage device 1806.

In the preceding description, various exemplary embodiments have been described with reference to the accompanying drawings. It will, however, be evident that various modifications and changes may be made thereto, and additional embodiments may be implemented, without departing from the scope of the invention as set forth in the claims that follow. For example, certain features of one embodiment described herein may be combined with or substituted for features of another embodiment described herein. The description and drawings are accordingly to be regarded in an illustrative rather than a restrictive sense.

What is claimed is:

1. A method comprising:
   linking together, by a media content presentation system, multiple, individual media content instances, wherein
      the linking together includes generating linking data that identifies a link between the multiple, individual media content instances, and
      the link between the multiple, individual media content instances comprises a two-way link in which one media content instance and another media content instance included in the multiple, individual media content instances are linked together by a directional link from the one media content instance to the another media content instance and by a reverse directional link from the another media content instance to the one media content instance; and
   randomizing, by the media content presentation system, a playback of a playlist that includes the linked media content instances and one or more unlinked media content instances, each of the linked media content instances and the one or more unlinked media content instances being available for randomized selection for playback during the randomizing of the playback of the playlist, wherein the randomizing of the playback of the playlist comprises randomly selecting a first media content instance included in the playlist for playback, identifying, based on the linking data, that the first media content instance corresponds to one of the one or more unlinked media content instances, playing the first media content instance as an individual media content instance within the randomizing of the playback of the playlist, randomly selecting a second media content instance included in the playlist for playback, identifying, based on the linking data, that the second media content instance corresponds to one of the linked media content instances included in the playlist, and playing the second media content instance and all of the linked media content instances, which are included in the playlist and are linked to the second media content instance, as an indivisible block of linked media content instances that are not divisible within the indivisible block by the randomizing of the playback of the playlist.

2. The method of claim 1, further comprising:
receiving, by the media content presentation system by way of a user interface, a user input command to link together the multiple, individual media content instances;
wherein the linking together is performed by the media content presentation system in response to the user input command.

3. The method of claim 1, further comprising:
detecting, by the media content presentation system, a satisfaction of a linking trigger condition;
wherein the linking together is performed automatically by the media content presentation system in response to the satisfaction of the linking trigger condition.

4. The method of claim 3, wherein the satisfaction of the linking trigger condition comprises an optimization of the multiple, individual media content instances for gapless playback.

5. The method of claim 1, further comprising:
receiving, by the media content presentation system by way of a user interface, a user input command to initiate the randomized playback of the playlist; and
playing back, by the media content presentation system, the playlist in response to the user input command, wherein the randomizing of the playback of the playlist is performed during the playing back of the playlist.

6. The method of claim 1, further comprising:
providing, by the media content presentation system, a user interface; and
displaying, by the media content presentation system in the user interface, a visual indication that the multiple, individual media content instances are linked together.

7. The method of claim 1, further comprising:
delinking, by the media content presentation system subsequent to the playing of the second media content instance and all of the linked media content instances that are included in the playlist and that are linked to the second media content instance as an indivisible block of linked media content instances, the linked media content instances;
randomizing, by the media content presentation system, another playback of the playlist; and processing, by the media content presentation system, the delinked media content instances as discrete media content instances within the randomizing of the another playback of the playlist.

8. The method of claim 7, further comprising:
receiving, by the media content presentation system by way of a user interface, a user input command to delink the linked media content instances;
wherein the delinking is performed by the media content presentation system in response to the user input command.

9. The method of claim 1, further comprising:
receiving, by the media content presentation system by way of a user interface, a user input request to add a media content instance included in the linked media content instances to another playlist, the requested media content instance having a link to one or more other media content instances included in the linked media content instances;
adding, by the media content presentation system, the requested media content instance to the another playlist; and
facilitating, by the media content presentation system based on the link of the requested media content instance, an addition of the one or more other media content instances included in the linked media content instances to the another playlist.

10. The method of claim 1, further comprising, during the playback of the playlist:
presenting, by the media content presentation system, a playback user interface that includes a selectable option to add a media content instance included in the playlist to another playlist;
detecting, by the media content presentation system, a user selection of the option; and
adding, by the media content presentation system in response to the user selection of the option, the media content instance to the another playlist.

11. The method of claim 1, further comprising, during the playback of the playlist:
presenting, by the media content presentation system, a playback user interface that includes a selectable option to delete a media content instance from the playlist;
detecting, by the media content presentation system, a user selection of the option; and
deleting, by the media content presentation system in response to the user selection of the option, the media content instance from the playlist.

12. The method of claim 1, further comprising, during the playback of the playlist:
presenting, by the media content presentation system, a playback user interface that includes a selectable option to temporarily disable a media content instance included in the playlist;
detecting, by the media content presentation system, a user selection of the option; and
temporarily disabling, by the media content presentation system in response to the user selection of the option, the media content instance such that the media content instance will be prevented from being played back during the playback of the playlist.

13. The method of claim 12, further comprising:
detecting, by the media content presentation system, a termination of the playback of the playlist; and
re-enabling, by the media content presentation system in response to the detecting of the termination of the playback of the playlist, the temporarily disabled media content instance such that the temporarily disabled media content instance is re-enabled and will be allowed to be played back in a subsequent playback of the playlist.

14. The method of claim 1, further comprising, during a playback of a particular media content instance within the playback of the playlist:
presenting, by the media content presentation system, a playback user interface that includes a selectable option to select the particular media content instance for processing;
detecting, by the media content presentation system, a user selection of the option; and
providing, by the media content presentation system, a plurality of additional selectable options for the processing of the particular media content instance, the additional selectable options comprising at least one of:
an option to add the particular media content instance to another playlist,
an option to access information about the particular media content instance, and
an option to generate and automatically populate a new playlist based on the particular media content instance.

15. The method of claim 1, wherein:
the second media content instance corresponds to the one media content instance; and
the playing of the second media content instance comprises selecting, based on the directional link between the one media content instance and the another media content instance, the another media content instance for playback immediately following a playback of the one media content instance within the randomizing of the playback of the playlist.

16. The method of claim 1, wherein:
the second media content instance corresponds to the one media content instance; and
the playing of the second media content instance comprises selecting, based on the reverse directional link between the another media content instance and the one media content instance, the one media content instance for playback immediately following a playback of the another media content instance within the randomizing of the playback of the playlist.

17. The method of claim 1, wherein the linking data is specific to the playlist such that the linking data identifies the linked media content instances as being linked in the playlist but not in an additional playlist.

18. At least one non-transitory computer-readable medium encoded with instructions configured to direct at least one processor to:
link together multiple, individual media content instances, wherein
the at least one processor links together the multiple, individual media content instances by generating linking data that identifies a link between the multiple, individual media content instances, and
the link between the multiple, individual media content instances comprises a two-way link in which one media content instance and another media content instance included in the multiple, individual media content instances are linked together by a directional link from the one media content instance to the another media content instance and by a reverse directional link from the another media content instance to the one media content instance; and
randomize a playback of a playlist that includes the linked media content instances and one or more unlinked media content instances, each of the linked media content instances and the one or more unlinked media content instances being available for randomized selection for playback during the randomizing of the playback of the playlist, wherein the at least one processor randomizes the playback of the playlist by
randomly selecting a first media content instance included in the playlist for playback,
identifying, based on the linking data, that the first media content instance corresponds to one of the one or more unlinked media content instances,
playing the first media content instance as an individual media content instance within the randomizing of the playback of the playlist,
randomly selecting a second media content instance included in the playlist for playback,
identifying, based on the linking data, that the second media content instance corresponds to one of the linked media content instances included in the playlist, and
playing the second media content instance and all of the linked media content instances, which are included in the playlist and are linked to the second media content instance, as an indivisible block of linked media content instances that are not divisible within the indivisible block by the randomizing of the playback of the playlist.

19. A system comprising:
at least one processor;
a media content management facility that directs the at least one processor to link together multiple, individual media content instances by generating linking data that identifies a link between the multiple, individual media content instances, wherein the link between the multiple, individual media content instances comprises a two-way link in which one media content instance and another media content instance included in the multiple, individual media content instances are linked together by a directional link from the one media content instance to the another media content instance and by a reverse directional link from the another media content instance to the one media content instance; and
a media content playback facility that directs the at least one processor to
randomize a playback of a playlist that includes the linked media content instances and one or more unlinked media content instances, each of the linked media content instances and the one or more unlinked media content instances being available for randomized selection for playback during the randomizing of the playback of the playlist, wherein the at least one processor randomizes the playback of the playlist by
randomly selecting a first media content instance included in the playlist for playback,
identifying, based on the linking data, that the first media content instance corresponds to one of the one or more unlinked media content instances,
playing the first media content instance as an individual media content instance within the randomizing of the playback of the playlist,
randomly selecting a second media content instance included in the playlist for playback,
identifying, based on the linking data, that the second media content instance corresponds to one of the linked media content instances included in the playlist, and playing the second media content instance and all of the linked media content instances, which are included in the playlist and are linked to the second media content instance, as an indivisible block of linked media content instances that are not divisible within the indivisible block by the randomizing of the playback of the playlist.

20. The system of claim 19, further comprising a non-transitory computer-readable medium communicatively coupled to the processor;
   wherein the media content management facility and the media content playback facility are implemented by a media player software application tangibly embodied on the non-transitory computer-readable medium.

\* \* \* \* \*